US012751128B2

(12) United States Patent
Okuno

(10) Patent No.: US 12,751,128 B2
(45) Date of Patent: Sep. 29, 2026

(54) LIGHT EMITTING ELEMENT AND PRODUCTION METHOD THEREFOR

(71) Applicant: TOYODA GOSEI CO., LTD., Kiyosu (JP)

(72) Inventor: Koji Okuno, Kiyosu (JP)

(73) Assignee: Toyoda Gosei Co., Ltd., Kiyosu (JP)

( * ) Notice: Subject to any disclaimer, the term of this patent is extended or adjusted under 35 U.S.C. 154(b) by 366 days.

(21) Appl. No.: 18/601,708

(22) Filed: Mar. 11, 2024

(65) Prior Publication Data

US 2024/0313034 A1 Sep. 19, 2024

(30) Foreign Application Priority Data

Mar. 16, 2023 (JP) ................................. 2023-041522

(51) Int. Cl.

| | |
|---|---|
| ***H10H 29/01*** | (2025.01) |
| ***H10H 20/01*** | (2025.01) |
| ***H10H 20/81*** | (2025.01) |
| ***H10H 20/812*** | (2025.01) |
| ***H10H 20/816*** | (2025.01) |
| ***H10H 20/825*** | (2025.01) |
| ***H10H 29/10*** | (2025.01) |

(52) U.S. Cl.

CPC .... *H10H 29/011* (2025.01); *H10H 20/01335* (2025.01); *H10H 20/812* (2025.01); *H10H 20/8162* (2025.01); *H10H 20/8215* (2025.01); *H10H 20/825* (2025.01); *H10H 29/10* (2025.01)

(58) Field of Classification Search

CPC ............ H10H 20/812; H10H 20/8162; H10H 20/825–8252; H10H 29/011; H10H 29/10

See application file for complete search history.

(56) References Cited

U.S. PATENT DOCUMENTS

2021/0305457 A1* 9/2021 Goshonoo ............ H10H 29/142

FOREIGN PATENT DOCUMENTS

| | | | |
|---|---|---|---|
| JP | 2003-273469 | A | 9/2003 |
| JP | 5854419 | B2 | 2/2016 |
| JP | 2021-158179 | A | 10/2021 |

OTHER PUBLICATIONS

Japanese Office Action dated Jan. 20, 2026 for Japanese Patent Application No. 2023-041522 with English translation.

* cited by examiner

*Primary Examiner* — Daniel P Shook

(74) *Attorney, Agent, or Firm* — McGinn IP Law Group, PLLC

(57) ABSTRACT

A light emitting element includes: a substrate; an n layer provided over the substrate as defined herein; a first active layer provided over the n layer as defined herein; a middle layer provided over the first active layer as defined herein; a second active layer provided over the middle layer as defined herein; a groove having a depth reaching the middle layer from a side of the second active layer; a first p layer provided over the second active layer as defined herein; and a second p layer provided over the middle layer exposed on a bottom surface of the groove as defined herein, and a non-n layer including a group III nitride semiconductor and containing O or Si and a p-type impurity is provided between the second active layer and the first p layer and between the middle layer and the second p layer.

10 Claims, 12 Drawing Sheets

LIGHT EMITTING ELEMENT AND PRODUCTION METHOD THEREFOR

CROSS-REFERENCE TO RELATED APPLICATION

This application is based on and claims priority under 35 USC 119 from Japanese Patent Application No. 2023-041522 filed on Mar. 16, 2023.

TECHNICAL FIELD

The present invention relates to a light emitting element and a production method therefor.

BACKGROUND ART

In recent years, high definition of displays has been required, and a micro LED display, in which each pixel is a minute LED on the order of 1 m to 100 m, has attracted attention.

Various full-color methods are known, and for example, a method in which three active layers emitting blue, green, and red light are sequentially stacked on the same substrate is known (for example, JP5854419B).

SUMMARY OF INVENTION

In a light emitting element in which three active layers are sequentially stacked on the same substrate, a step of once completing crystal growth, taking a wafer out of a growth furnace, forming grooves, and then charging the wafer back into the growth furnace to regrow a semiconductor layer is necessary. However, according to studies of the inventors, it has been found that the wafer is contaminated with impurities during this step, and the impurities act as donors, forming an unintended n layer at a regrowth interface, resulting in a reduction in light emission efficiency.

The present invention has been made in view of such a background, and an object thereof is to provide a light emitting element having a reduced reduction in light emission efficiency, and a production method therefor.

An aspect of the invention is directed to a light emitting element comprising a group III nitride semiconductor, including:

- a substrate;
- an n layer that is provided over the substrate and comprises an n-type group III nitride semiconductor;
- a first active layer that is provided over the n layer and has a predetermined emission wavelength;
- a middle layer that is provided over the first active layer and comprises a group III nitride semiconductor containing In;
- a second active layer that is provided over the middle layer and has an emission wavelength different from the emission wavelength of the first active layer;
- a groove having a depth reaching the middle layer from a side of the second active layer;
- a first p layer that is provided over the second active layer and comprises a p-type group III nitride semiconductor; and
- a second p layer that is provided over the middle layer exposed on a bottom surface of the groove and comprises a p-type group III nitride semiconductor, wherein
- a non-n layer comprising a group III nitride semiconductor and containing O or Si and a p-type impurity is provided between the second active layer and the first p layer and between the middle layer and the second p layer.

An another aspect of the invention is directed to a method for producing a light emitting element comprising a group III nitride semiconductor, including:

- an n layer forming step of forming an n layer comprising an n-type group III nitride semiconductor over a substrate;
- a first active layer forming step of forming a first active layer having a predetermined emission wavelength over the n layer;
- a middle layer forming step of forming a middle layer comprising a group III nitride semiconductor containing In over the first active layer;
- a second active layer forming step of forming a second active layer having an emission wavelength different from the emission wavelength of the first active layer over the middle layer;
- a groove forming step of forming a groove having a depth reaching the middle layer from a side of the second active layer; and
- a p layer forming step of forming a first p layer comprising a p-type group III nitride semiconductor and a second p layer comprising a p-type group III nitride semiconductor over the second active layer and over the middle layer exposed on a bottom surface of the groove, respectively, wherein
- a non-n layer comprising a group III nitride semiconductor and containing O or Si and a p-type impurity is formed after the groove forming step and before the p layer forming step.

According to the above aspects in the present invention, when a non-n layer containing a p-type impurity is provided, the layer can be made in a co-doped state at the regrowth interface and the regrowth interface can be neutralized or made to be p-type. As a result, the reduction in light emission efficiency can be prevented.

DETAILED DESCRIPTION OF THE INVENTION

Figure 1:
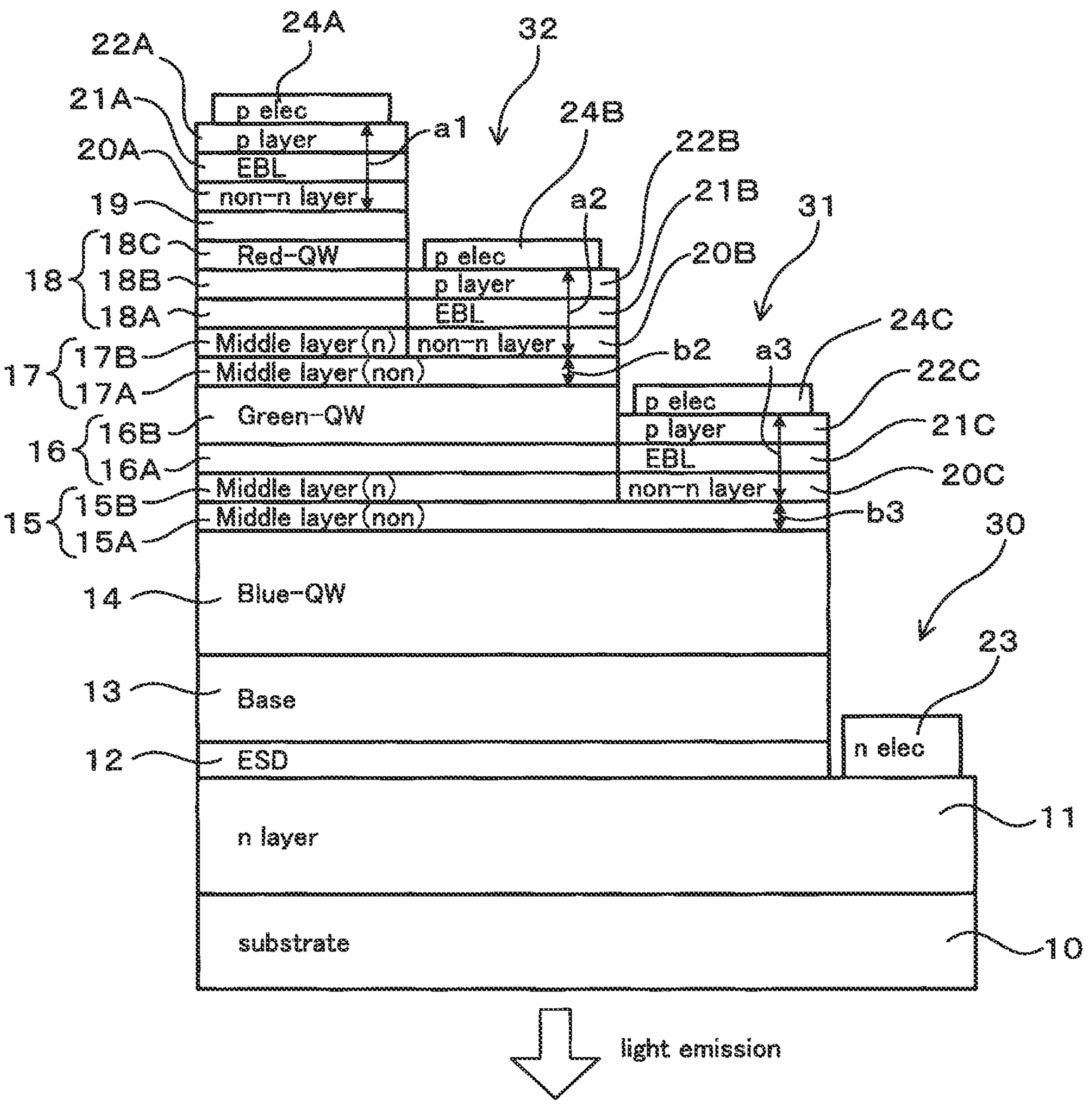
FIG. 1 is a diagram showing a configuration of a light emitting element according to a first embodiment, and is a cross-sectional view in a direction perpendicular to a main surface of a substrate.

A light emitting element is a light emitting element made of a group III nitride semiconductor. The light emitting element includes: a substrate; an n layer provided on the substrate and made of an n-type group III nitride semiconductor; a first active layer provided on the n layer and having a predetermined emission wavelength; a middle layer provided on the first active layer and made of a group III nitride semiconductor containing In; a second active layer provided on the middle layer and having an emission wavelength different from the emission wavelength of the first active layer; a groove having a depth reaching the middle layer from the second active layer; a first p layer provided on the second active layer and made of a p-type group III nitride semiconductor; and a second p layer provided on the middle layer exposed on a bottom surface of the groove and made of a p-type group III nitride semiconductor. A non-n layer made of a group III nitride semiconductor and containing O or Si and a p-type impurity is provided between the second active layer and the first p layer and between the middle layer and the second p layer.

In the above the light emitting element, the non-n layer may be made of a group III nitride semiconductor containing Al, and may have an Al composition of 0.5% to 30%.

In the above the light emitting element, a p-type impurity concentration in the non-n layer may be $1\times10^{18}$ $cm^{-3}$ to $100\times10^{18}$ $cm^{-3}$.

A method for producing a light emitting element is a method for producing a light emitting element made of a group III nitride semiconductor. The method for producing a light emitting element includes: an n layer forming step of forming an n layer made of an n-type group III nitride semiconductor on a substrate; a first active layer forming step of forming a first active layer having a predetermined emission wavelength on the n layer; a middle layer forming step of forming a middle layer made of a group III nitride semiconductor containing In on the first active layer; a second active layer forming step of forming a second active layer having an emission wavelength different from the emission wavelength of the first active layer on the middle layer; a groove forming step of forming a groove having a depth reaching the middle layer from the second active layer; and a p layer forming step of forming a first p layer and a second p layer made of a p-type group III nitride semiconductor on the second active layer and on the middle layer exposed on a bottom surface of the groove, respectively, in which a non-n layer made of a group III nitride semiconductor and containing O or Si and a p-type impurity is formed after the groove forming step and before the p layer forming step.

In the above method for producing a light emitting element, the non-n layer may be made of a group III nitride semiconductor containing Al, and may have an Al composition of 0.5% to 30%.

In the above method for producing a light emitting element, a p-type impurity concentration in the non-n layer may be $1\times10^{18}$ $cm^{-3}$ to $100\times10^{18}$ $cm^{-3}$.

In the non-n layer forming step, a molar ratio of a p-type dopant gas to a group III metal raw material gas may be 0.0005 or more and 0.02 or less.

First Embodiment

FIG. 1 is a diagram showing a configuration of a light emitting element according to a first embodiment. The light emitting element according to the first embodiment can emit blue, green, and red light. In addition, the light emitting element according to the first embodiment is a flip-chip type that extracts light from a back surface of a substrate, and is mounted on a mounting substrate (not shown) in a face-down manner. Note that, in the first embodiment, one pixel has a structure of one chip, but a monolithic type may be used. That is, it may be a micro LED display element in which the element structure in the first embodiment is arranged in a matrix on the same substrate.

1. Configuration of Light Emitting Element

As shown in FIG. 1, the light emitting element according to the first embodiment includes a substrate 10, an n layer 11, an ESD layer 12, a base layer 13, a first active layer 14, a first middle layer 15, a second active layer 16, a second middle layer 17, a third active layer 18, a protective layer 19, non-n layers 20A to 20C, electron blocking layers 21A to 21C, p layers 22A to 22C, an n electrode 23, and p electrodes 24A to 24C.

The substrate 10 is a growth substrate on which a group III nitride semiconductor is grown. For example, sapphire, Si, GaN, or $ScAlMgO_4$ (SAM).

The n layer 11 is an n-type semiconductor layer provided on the substrate 10 via a low-temperature buffer layer or a high-temperature buffer layer (not shown). However, the buffer layer may be provided as necessary, and the buffer layer may not be provided when the substrate is GaN. The n layer 11 is, for example, n-GaN, n-AlGaN, or n-InGaN. A Si concentration is, for example, $1\times10^{18}$ $cm^{-3}$ to $100\times10^{18}$ $cm^{-3}$.

The ESD layer 12 is a semiconductor layer provided on the n layer 11, and is a layer provided to improve an electrostatic breakdown voltage. The ESD layer 12 may be provided as necessary and may be omitted. The ESD layer 12 is, for example, non-doped or lightly Si-doped GaN, InGaN, or AlGaN.

The base layer 13 is a semiconductor layer having a superlattice structure provided on the ESD layer 12, and is a layer for relaxing lattice strain in a semiconductor layer formed on the base layer 13. The base layer 13 may be provided as necessary and may be omitted. The base layer 13 is formed by alternately stacking group III nitride semiconductor thin films having different compositions (for example, two of GaN, InGaN, and AlGaN), and the number of pairs is, for example, 3 to 30. The base layer 13 may be non-doped or doped with Si by about $1\times10^{17}$ $cm^{-3}$ to $100\times10^{17}$ $cm^{-3}$. It is not necessary to have a superlattice structure as long as the strain can be relaxed. Any material may be used as long as a lattice constant difference is small at a hetero-interface with the first active layer 14. For example, an InGaN layer, an AlInN layer, or an AlGaIn layer may be used.

The first active layer 14 is a light emitting layer having an SQW or MQW structure provided on the base layer 13. An emission wavelength is blue and is 430 nm to 480 nm. The first active layer 14 has a structure in which a barrier layer made of AlGaN and a well layer made of InGaN are alternately stacked for 1 to 9 pairs. The number of pairs is more preferably 1 to 7, and still more preferably 1 to 5.

The first middle layer 15 is a semiconductor layer provided on the first active layer 14, and is positioned between the first active layer 14 and the second active layer 16. The first middle layer 15 is a layer provided to enable light emission from the first active layer 14 and light emission from the second active layer 16 to be separately controlled. In addition, it also has the role of protecting the first active layer 14 from etching damage when forming a second groove 31 to be described later.

The first middle layer 15 has a structure in which a non-doped layer 15A and an n layer 15B are sequentially stacked from the first active layer 14. The non-doped layer 15A and the n layer 15B may be made of the same material except for impurities. A reason why the first middle layer 15 has such a two-layer structure will be described later.

The material of the first middle layer 15 is a group III nitride semiconductor containing In, and is preferably InGaN, for example. With a surfactant effect of In, roughness on a surface of the first middle layer 15 can be prevented and surface flatness can be improved. In addition, the lattice strain can be relaxed.

It is sufficient that an In composition (a molar ratio of In to all group III metals in the group III nitride semiconductor) of the first middle layer 15 is set to have a band gap in which light emitted from the first active layer 14 and the second active layer 16 is not absorbed. A preferred In composition is 10% or less, more preferably 5% or less, and still more preferably 2% or less. When the In composition is greater than 10%, the surface of the first middle layer 15 is rough. The In composition is any as long as it is greater than 0%, and may be at a doping level (a level that does not form a mixed crystal). For example, GaN having an In concentration of $1\times10^{14}$ $cm^{-3}$ or more and $1\times10^{22}$ $cm^{-3}$ or less.

The non-doped layer 15A is non-doped, and the n layer 15B is Si-doped. A Si concentration in the n layer 15B is preferably $1\times10^{17}$ $cm^{-3}$ to $1000\times10^{17}$ $cm^{-3}$. It is preferably $10\times10^{17}$ $cm^{-3}$ to $100\times10^{17}$ $cm^{-3}$, and more preferably $20\times10^{17}$ $cm^{-3}$ to $80\times10^{17}$ $cm^{-3}$. The n layer 15B may be modulated and doped with Si, or there may be a non-doped region in a partial region of the n layer 15B.

A thickness of the first middle layer 15 is preferably 20 nm to 150 nm. When the thickness is more than 150 nm, the surface of the first middle layer 15 may be rough. When the thickness is less than 20 nm, there is a possibility that it is difficult to control a depth of the second groove 31 to be within the non-doped layer 15A when forming the second groove 31 to be described later. It is more preferably 30 nm to 100 nm, and still more preferably 50 nm to 80 nm.

In addition, a thickness of the non-doped layer 15A is preferably 10 nm or more. This is for controlling an etching depth and avoiding etching damage to the first active layer 14. In addition, a thickness of the n layer 15B is preferably 10 nm or more. This is for independently controlling light emitting characteristics of each active layer.

The second active layer 16 has a structure in which a strain relaxation layer 16A and an SQW or MQW quantum well structure layer (light emitting layer) 16B are sequentially stacked. An emission wavelength of the quantum well structure layer 16B is green and is 510 nm to 570 nm. The quantum well structure layer 16B has a structure in which a barrier layer made of GaN and a well layer made of InGaN are alternately stacked for 1 to 7 pairs. The number of pairs is more preferably 1 to 5, and still more preferably 1 to 3. The number of pairs is preferably equal to or less than that of the first active layer 14, and more preferably less than that of the first active layer 14.

The strain relaxation layer 16A has an SQW structure in which a barrier layer and a well layer are sequentially stacked, and has a quantum well structure in which a thickness of the well layer is adjusted to be thin so as not to emit light. For example, when the thickness of the well layer is set to 1 nm or less, it is possible to prevent the well layer from emitting light. The barrier layer is AlGaN, and the well layer is InGaN. It is sufficient that a wavelength corresponding to band edge energy in the well layer of the strain relaxation layer 16A is shorter than the emission wavelength of the quantum well structure layer 16B, and is, for example, 400 nm to 460 nm when the emission wavelength is 500 nm to 560 nm. Preferably, the wavelength is 40 nm to 100 nm shorter than the emission wavelength of the quantum well structure layer 16B. In this case, a growth temperature for the strain relaxation layer 16A is 700° C. to 800° C.

The wavelength corresponding to the band edge energy in the well layer of the strain relaxation layer 16A may be equal to the emission wavelength of the first active layer 14. In this case, the strain relaxation layer 16A may be grown at a growth temperature same as that for the first active layer 14.

The band edge energy in the well layer of the strain relaxation layer 16A can be controlled based on the thickness of the well layer. That is, when the thickness of the well layer of the strain relaxation layer 16A is made sufficiently small, energy in a sub-band within the well increases and the band edge energy increases. Accordingly, the wavelength may be shorter than the emission wavelength of the quantum well structure layer 16B. The growth temperature is any, and the strain relaxation layer 16A may be grown at a growth temperature same as that for the quantum well structure layer 16B. Further, when the film thickness of the well layer of the strain relaxation layer 16A is made small, the energy in the sub-band further increases, and an energy difference with the barrier layer is smaller. That is, it is close to band edge energy in the barrier layer. As a result, it is difficult to confine carriers in the well layer of the strain relaxation layer 16A, making it difficult to emit light. Therefore, the well layer functions as a part of the barrier layer of the quantum well structure layer 16B, and at the same time, a strain relaxation effect can be obtained.

In this way, by forming the strain relaxation layer 16A having a well layer with worse carrier confinement than the well layer of the quantum well structure layer 16B, it is possible to form the strain relaxation layer 16A that does not emit light.

In short, it is sufficient that a material and a layer configuration of the strain relaxation layer 16A are set such that an average lattice constant of the entire strain relaxation layer 16A is between a lattice constant of the first middle layer 15 and a lattice constant of the quantum well structure layer 16B, and the thickness of the well layer is set such that the strain relaxation layer 16A does not emit light.

The strain relaxation layer 16A may have an MQW structure in which a barrier layer and a well layer are stacked for 2 or more pairs, and it is preferable to have an SQW structure since the second active layer 16 is thick.

As described above, when the strain relaxation layer 16A is provided, strain in the quantum well structure layer 16B stacked thereon can be relaxed, and a crystal quality of the well layer of the quantum well structure layer 16B can be improved.

It is preferable to set a ratio of a thickness of the first active layer 14 to a thickness of the second active layer 16 to be 30% or less. The strain in the quantum well structure layer 16B can be more efficiently relaxed, and a pn junction distance is constant below each of the p electrodes 24A to 24C, making device characteristics uniform below each of the p electrodes 24A to 24C.

The second middle layer 17 is semiconductor layer provided on the second active layer 16, and is positioned between the second active layer 16 and the third active layer 18. The second middle layer 17 is provided for a reason same as that of the first middle layer 15, and is a layer provided to enable light emission from the second active layer 16 and light emission from the third active layer 18 to be separately controlled. In addition, it also has the role of protecting the second active layer 16 from etching damage when forming a third groove 32 to be described later.

The second middle layer 17 has a structure in which a non-doped layer 17A and an n layer 17B are sequentially stacked from the second active layer 16. The non-doped layer 17A and the n layer 17B have a structure same as that of the non-doped layer 15A and the n layer 15B. That is, the non-doped layer 17A and the n layer 17B are made of a material same as that of the non-doped layer 15A and the n layer 15B except for impurities, and a thickness range is also the same as that of the non-doped layer 15A and the n layer 15B. The non-doped layer 17A is non-doped, and the n layer 17B is Si-doped. A reason why the second middle layer 17 has such a two-layer structure will be described later.

A material of the second middle layer 17 is same as that of the first middle layer 15. The first middle layer 15 and the second middle layer 17 may be made of the same material. In addition, a thickness of the second middle layer 17 is also same as that of the first middle layer 15, and the first middle layer 15 and the second middle layer 17 may have the same thickness. However, it is preferable to make it thinner than the first middle layer 15 and to have an In composition larger than that in the first middle layer 15. This is because the second active layer 16 that emits green light is more susceptible to thermal damage than the first active layer 14 that emits blue light, and an influence of the strain at an interface is larger.

Here, the reason why the first middle layer 15 and the second middle layer 17 have a two-layer structure will be described. First, the pn junction distance will be described. The pn junction distance corresponds to a film thickness of a depleted film at zero bias. In an LED, it corresponds to a total film thickness of non-doped or lightly doped active layers sandwiched between a p layer having a high concentration of acceptor impurities and an n layer having a high concentration of donor impurities.

When the first middle layer 15 and the second middle layer 17 are non-doped, the pn junction distance (thickness of a depletion layer) corresponds to a distance from the electron blocking layer 21A heavily doped with acceptor impurities to the n layer 11 heavily doped with donor impurities in a region below the p electrode 24A, that is, a film thickness including the first active layer 14, the second active layer 16, the third active layer 18, the first middle layer 15, and the second middle layer 17. In addition, it corresponds to a distance from the electron blocking layer 21B heavily doped with acceptor impurities to the n layer 11 below the p electrode 24B, that is, a film thickness including the first active layer 14, the second active layer 16, the first middle layer 15, and a part of the second middle layer 17. Further, it corresponds to a distance from the electron blocking layer 21C heavily doped with acceptor impurities to the n layer 11 below the p electrode 24C, that is, a film thickness including the first active layer 14 and a part of the first middle layer 15.

Therefore, the pn junction distance is different in these three cases, and a drive voltage or current injection efficiency, and a reverse current are different. In a case of applying a voltage to the p electrode 24A to cause the third active layer 18 to emit light, there is a possibility that electron and hole carriers are supplied to all the active layers, and that the second active layer 16 and the first active layer 14 also emit light. Similarly, in a case of applying a voltage to the p electrode 24B to cause the second active layer 16 to emit light, there is a possibility that the first active layer 14 also emits light.

Such a problem is solved by the structure of the middle layer. That is, the first middle layer 15 has two layers: the non-doped layer 15A and the n layer 15B doped with a high concentration of donor impurities. The second middle layer 17 has two layers: the non-doped layer 17A and the n layer 17B doped with a high concentration of donor impurities. The n layers 15B and 17B are doped with Si to be n-type.

Therefore, the pn junction distance is a distance from the electron blocking layer 21A to the n layer 17B of the second middle layer 17 in the region below the p electrode 24A, a distance from the electron blocking layer 21B to the n layer 15B of the first middle layer 15 in the region below the p electrode 24B, and a distance is from the electron blocking layer 21C to the n layer 11 in the region below the p electrode 24C. That is, the pn junction distance below all electrodes corresponds to the total film thickness including not a plurality of active layers but one active layer and a non-doped layer in the middle layer.

Here, when the thickness of the non-doped layer 15A of the first middle layer 15 and the non-doped layer 17A of the second middle layer 17 are appropriately controlled, the pn junction distances can be made equal in these three cases. As a result, variations in drive voltage, current injection efficiency, and reverse current can be prevented in these three cases, and uniform control is possible. Further, in these three cases, only one first active layer 14, one second active layer 16, and one third active layer 18 are included in the pn junction, and the n layer as a middle layer serves as a barrier layer for holes. Therefore, it is difficult for holes to be injected into a lower active layer beyond the n layer as a middle layer. As a result, it is possible to prevent the layer positioned in the pn junction other than the active layer to emit light from emitting light.

The third active layer 18 has a structure in which a first strain relaxation layer 18A, a second strain relaxation layer 18B, and an SQW or MQW quantum well structure layer 18C are sequentially stacked. An emission wavelength of the quantum well structure layer 18C is red and is 590 nm to 700 nm. The quantum well structure layer 18C has a structure in which a barrier layer made of InGaN and a well layer made of InGaN are alternately stacked for 1 to 7 pairs. The number of pairs is more preferably 1 to 5, and still more preferably 1 to 3. In addition, the number of pairs is preferably equal to or less than that of the quantum well structure layer 16B of the second active layer 16, and more preferably less than that of the quantum well structure layer 16B of the second active layer 16.

The first strain relaxation layer 18A has a structure same as that of the strain relaxation layer 16A of the second active layer 16. It is sufficient that a wavelength corresponding to band edge energy in a well layer of the first strain relaxation layer 18A is shorter than the emission wavelength of the quantum well structure layer 16B, and is, for example, 400 nm to 460 nm.

The second strain relaxation layer 18B has a wavelength corresponding to band edge energy in a well layer of the second strain relaxation layer 18B that is shorter than the emission wavelength of the quantum well structure layer 18C and that is longer than the wavelength corresponding to the band edge energy in the well layer of the first strain relaxation layer 18A. For example, it is 510 nm to 570 nm. The others are same as the first strain relaxation layer 18A.

A difference between the wavelength corresponding to the band edge energy in the well layer of the first strain relaxation layer 18A and the wavelength corresponding to the band edge energy in the well layer of the second strain relaxation layer 18B and a difference between the wavelength corresponding to the band edge energy in the well layer of the second strain relaxation layer 18B and the emission wavelength of the quantum well structure layer 18C are preferably 40 nm to 100 nm.

It is preferable to set a ratio of the thickness of the first active layer 14 to a thickness of the third active layer 18 or a ratio of the thickness of the second active layer 16 to the thickness of the third active layer 18 to be 30% or less. Strain in the quantum well structure layer 18C can be more efficiently relaxed, and the pn junction distance is constant below each of the p electrodes 24A to 24C, making device characteristics uniform below each of the p electrodes 24A to 24C.

In this way, when the first strain relaxation layer 18A and the second strain relaxation layer 18B are provided, the strain can be relaxed in stages, and the strain in the quantum well structure layer 18C stacked thereon can be effectively relaxed. As a result, a quality of the well layer of the quantum well structure layer 18C can be improved.

Note that, in the third active layer 18, the strain is relaxed in two stages by the first strain relaxation layer 18A and the second strain relaxation layer 18B, and the strain may be relaxed in three or more stages by providing three or more strain relaxation layers. In the second active layer 16, a plurality of strain relaxation layers 16A may be provided to relax the strain in stages.

A strain relaxation layer may also be provided in the first active layer 14 in the same manner. In this case, a growth temperature for the strain relaxation layer is, for example, 800° C. to 900° C.

The protective layer 19 is a semiconductor layer provided on the third active layer 18. The protective layer 19 is a layer protecting the active layer and also functioning as an electron blocking layer. The protective layer 19 may be made of a material having a band gap wider than that of the well layer of the third active layer 18, such as AlGaN, GaN, or InGaN. A thickness of the protective layer 19 is preferably 2.5 nm to 50 nm, and more preferably 5 nm to 25 nm. The protective layer 19 may be doped with impurities or Mg. In this case, a Mg concentration is preferably $1\times10^{18}$ $cm^{-3}$ to $1000\times10^{18}$ $cm^{-3}$.

A partial region of the protective layer 19 is etched to provide grooves, and the third groove 32 reaching the second middle layer 17 from the protective layer 19, the second groove 31 reaching the first middle layer 15, and a first groove 30 reaching the n layer 11 are provided.

The third groove 32 has a depth reaching the non-doped layer 17A of the second middle layer 17. In this way, by removing the n layer 17B of the second middle layer 17 below the p electrode 24B, the n layer is not positioned on the second active layer 16, and the second active layer 16 emits light. The second groove 31 has a depth reaching the non-doped layer 15A of the first middle layer 15. For the same reason, by removing the n layer 15B of the first middle layer 15 below the p electrode 24C, the n layer is not positioned on the first active layer 14, and the first active layer 14 emits light.

The non-n layers 20A to 20C are provided in contact with the protective layer 19, the non-doped layer 17A of the second middle layer 17 exposed on a bottom surface of the third groove 32, and the non-doped layer 15A of the first middle layer 15 exposed on a bottom surface of the second groove 31, respectively. The non-n layers 20A to 20C are layers obtained by taking a wafer out of a growth furnace and then charging the wafer back into the growth furnace for crystal growth.

A Mg concentration in the non-n layers 20A to 20C is $0.1\times10^{18}$ $cm^{-3}$ to $100\times10^{18}$ $cm^{-3}$. A reason why the non-n layers 20A to 20C are doped with Mg in such a concentration range is as follows.

In the light emitting element according to the first embodiment, as to be described later in a production process, the wafer is once taken out of the growth furnace and exposed to the atmosphere in order to form the third groove 32 or the second groove 31. At this time, a surface of the wafer is contaminated with elements such as O and Si. Impurities can be removed to some extent by washing, but cannot be removed completely.

These impurities are unintended n-type impurities and are non-light-emitting recombination centers. In addition, an unintended n layer is formed, changing a band structure. For example, formation of the n layer changes a built-in potential in the pn junction, which influences injection efficiency of electrons or holes, causing a reduction in light emission efficiency. In particular, hole injection into the active layer is inhibited by the n layer, resulting in a reduction in light emission efficiency. For the above reasons, when a regrowth interface is present near the active layer, particularly within the pn junction, the light emission efficiency is reduced remarkably. In the light emitting element according to the first embodiment, an interface between the protective layer 19 and the non-n layer 20A, an interface between the non-doped layer 17A and the non-n layer 20B, and an interface between the non-doped layer 15A and the non-n layer 20C are regrowth interfaces and are within the pn junction.

Therefore, in the first embodiment, by doping the non-n layers 20A to 20C with Mg, the unintended n layer at the regrowth interface is neutralized (increased resistance, insulated) or made to be p-type. Through studies conducted by the inventors, it has been found that a concentration of O or Si at the regrowth interface is about $0.1\times10^{18}$ $cm^{-3}$ to $100\times10^{18}$ $cm^{-3}$. Therefore, when the Mg concentration in the non-n layers 20A to 20C is set to $0.1\times10^{18}$ $cm^{-3}$ to $100\times10^{18}$ $cm^{-3}$, which is equal to the concentration of O or Si, which are n-type impurities, or equal to or greater than the Mg concentration, the layer is in a co-doped state and the regrowth interface is neutralized or made to be p-type, making it not an n layer.

Due to the neutralization at the regrowth interface, the substantial n layer is a lower part (substrate 10 side) of the active layer (the first active layer 14, the second active layer 16, and the third active layer 18). Accordingly, improvement in hole injection efficiency into the active layer and improvement in light emission efficiency are achieved.

A material of the non-n layers 20A to 20C is preferably AlGaN. An Al composition is, for example, 0.5% to 30%. Being made of AlGaN, the non-n layers 20A to 20C can function as an electron blocking layer. A thickness of the non-n layers 20A to 20C is, for example, 0.5 nm to 10 nm.

The electron blocking layers 21A to 21C are semiconductor layers provided on the non-n layer layers 20A to 20C, respectively, and are layers for blocking electrons injected from the n layer 11 in order to efficiently confine the electrons in the first active layer 14, the second active layer 16, and the third active layer 18. The electron blocking layer may be a single layer of GaN or AlGaN, or may have a structure in which two or more of AlGaN, GaN, and InGaN are stacked, or a structure in which the above materials are stacked with only the composition ratio changed. Alternatively, the electron blocking layer may have a superlattice structure. A thickness of the electron blocking layers 21A to 21C is preferably 5 nm to 50 nm, and more preferably 5 nm to 25 nm. A Mg concentration in the electron blocking layers 21A to 21C is preferably $1\times10^{19}$ $cm^{-3}$ to $100\times10^{19}$ $cm^{-3}$.

The p layers 22A to 22C are semiconductor layers provided on the electron blocking layers 21A to 21C, respectively, and each include a first layer and a second layer sequentially from the electron blocking layer 21. The first layer is preferably p-GaN or p-InGaN. A thickness of the first layer is preferably 10 nm to 500 nm, more preferably 10 nm to 200 nm, and still more preferably 10 nm to 100 nm. A Mg concentration in the first layer is preferably $1\times10^{19}$ $cm^{-3}$ to $100\times10^{19}$ $cm^{-3}$. The second layer is preferably p-GaN or p-InGaN. A thickness of the second layer is preferably 2 nm to 50 nm, more preferably 4 nm to 20 nm, and still more preferably 6 nm to 10 nm. A Mg concentration in the second layer is preferably $1\times10^{20}$ $cm^{-3}$ to $100\times10^{20}$ $cm^{-3}$.

The n electrode 23 is an electrode provided on the n layer 11 exposed on a bottom surface of the first groove 30. When the substrate 10 is made of a conductive material, the n electrode 23 may be provided on a back surface of the substrate 10 without providing the first groove 30. A material of the n electrode 23 is, for example, Ti/Al or V/Al.

The p electrodes 24A to 24C are electrodes provided on the p layers 22A to 22C, respectively. A material of the p electrodes 24A to 24C is preferably a material that has a high reflectance of light at the emission wavelength and has low contact resistance with respect to the p layers 22A to 22C. For example, Ag, Ni/Au, Co/Au, ITO/Ni/Al, Rh, or Ru. Among the red light emitted from the third active layer 18, light directed toward the p layer 22A is reflected by the p electrode 24A and goes toward the substrate 10. Similarly, among the green light emitted from the second active layer 16, light directed toward the p layer 22B is reflected by the p electrode 24B and goes toward the substrate 10, and among the blue light emitted from the first active layer 14, light directed toward the p layer 22C is reflected by the p electrode 24C and goes toward the substrate 10.

2. Setting of Thickness of Each Layer

The red light emitted from the third active layer 18 includes light emitted toward the substrate 10 and light emitted toward a side opposite to the substrate 10 and directed toward the substrate 10 after being reflected by the p electrode 24A, causing interference. The same applies to the green light emitted from the second active layer 16 and the blue light emitted from the first active layer 14. In the light emitting element according to the first embodiment, the element structure is set such that light emission colors of blue, green, and red are amplified by the interference of the light. Specifically, the settings are as follows.

First, thicknesses a1 to a3, b2, and b3 are defined. The thickness a1 is a total film thickness of the non-n layer 20A, the electron blocking layer 21A, and the p layer 22A. The thickness a2 is a total film thickness of the non-n layer 20B, the electron blocking layer 21B, and the p layer 22B. The thickness a3 is a total film thickness of the non-n layer 20C, the electron blocking layer 21C, and the p layer 22C. The thickness b2 is a thickness of a region in the non-doped layer 17A of the second middle layer 17 that is thinned by the third groove 32. The thickness b3 is a thickness of a region in the non-doped layer 15A of the first middle layer 15 that is thinned by the second groove 31.

The thicknesses a1 to a3, b2, and b3 are set to satisfy the following expressions (1) to (3). Note that, in the expressions (1) to (3), interference effects at all emitting angles are integrated, and an range is set such that an overall light output is maximized.

$$(m-0.1)\times(\lambda R/nR) < a1 < (m+0.1)\times(\lambda R/nR) \quad (1)$$

$$(m-0.1)\times(\lambda G/nG) < a2+b2 < (m+0.1)\times(\lambda R/nR) \quad (2)$$

$$(m-0.1)\times(\lambda B/nB) < a3+b3 < (m+0.1)\times(\lambda B/nB) \quad (3)$$

In the expressions (1) to (3), m≈0.2, 0.7, 1.2, . . . . Here, "≈" means that an error of about 0.1 is allowed for the value of m. For example, m≈0.7 means a range of about 0.6 to 0.8. The values of m in the expressions may be different from each other.

Note that, in a case of making settings such that the light output is attenuated due to the interference effect, it is sufficient to set m≈ 0.5, 1.0, 1.5, . . . in the expressions (1) to (3).

The above value of m at which the light output is amplified or attenuated is slightly deviated due to a phase shift in a reflective metal film. The above value of m roughly corresponds to cases of Ni/Au, Rh, Ru, Al, etc., which are generally used as reflective metals, and many other reflective metals also have values close to the above value. However, the value of m at which the light output is amplified or attenuated is not particularly limited to the above value.

In the expressions (1) to (3), λR is the emission wavelength of the third active layer 18 (red), G is the emission wavelength of the second active layer 16 (green), and λB is the emission wavelength of the first active layer 14 (blue). λR is a refractive index at a wavelength λR, and is an average refractive index of all the non-n layer 20A, the electron blocking layer 21A, and the p layer 22A. nG is a refractive index at a wavelength λG, and is an average refractive index of all the non-doped layer 17A, the non-n layer 20B, the electron blocking layer 21B, and the p layer 22B. nB is a refractive index at a wavelength λB, and is an average refractive index of all the non-doped layer 15A, the non-n layer 20C, the electron blocking layer 21C, and the p layer 22C.

The thicknesses a1 to a3 can be adjusted by separately forming the non-n layers 20A to 20C, the electron blocking layers 21A to 21B, and the p layers 22A to 22C. In addition, b2 and b3 can be adjusted by the etching depth when forming the third groove 32 and the second groove 31.

As specific means for setting the thicknesses a1 to a3, b2, and b3, a1 to a3 are set to predetermined values (particularly a1=a2=a3), and b2 and b3 are adjusted to satisfy the above expressions. Alternatively, b2 and b3 are set to predetermined values (particularly b2=b3), and a1 to a3 are adjusted to satisfy the above expressions. Accordingly, there are fewer parameters to set, and the light emitting element according to the first embodiment can be easily produced. Note that, in the case of adjusting a1, what is necessary is just to adjust the thickness of at least one layer among the non-n layer 20A, the electron blocking layer 21A, and the p layer 22A.

The above expressions are guidelines for amplification and attenuation of the light output due to the interference effect, and is sufficiently within a range where the interference effect of the light can be obtained. For example, a range where an amplification factor is 50% to 100% is sufficient. The amplification factor is preferably 70% to 100%, and more preferably 80% to 100%. Here, the amplification factor is 100% when the light output reaches the maximum due to the interference, and 0% when the light output takes a midpoint between the maximum value and the minimum value. The amplification factor may be different for each color.

Although m may be optionally selected, a larger value of m means that a distance (film thickness) in a normal direction from a light emitting surface to a reflective surface is longer. Since a crystal layer, particularly a crystal layer containing impurities, absorbs a considerable amount of light, as the distance is longer, the amount of light absorbed increases, and therefore an amplification effect due to the interference of the light decreases. Therefore, the value of m is preferably 2.3 or less, more preferably 1.8 or less, and still more preferably 1.2 or less. A lower limit of m at which the amplification effect obtained by the interference of the light can be obtained is 0.1, and the distance in the normal direction from the light emitting surface to the reflective surface is the shortest. In this case, it is difficult to obtain a sufficient thickness necessary for the non-n layers 20A to 20C, the electron blocking layers 21A to 21C, and the p layers 22A to 22C. Therefore, m is preferably 0.3 or more.

In the expressions (1) to (3), in order to satisfy $m \approx 0.2, 0.7, 1.2, \ldots$, by setting a1, a2+b2, and a3+b3, amplification of the light emitted from all active layers can be expected.

In this way, in the light emitting element according to the first embodiment, since the thicknesses a1 to a3, b2, and b3 are set to satisfy the expressions (1) to (3), the interference of light can be controlled so as to amplify each of the red light from the third active layer 18, the green light from the second active layer 16, and the blue light from the first active layer 14.

Note that, in the first embodiment, the thicknesses a1 to a3, b2, and b3 are set to amplify all three colors of red, green, and blue by the interference. However, one or two of the three colors may be amplified. For example, since red and green have light emission efficiency lower than that of blue, only red and green may be amplified. In addition, since red has the lowest light emission efficiency among the three colors, only red may be amplified.

Further, one or two of the three colors may be attenuated due to the interference. For example, since blue has light emission efficiency higher than that of red and green, only blue may be attenuated. In this case, an attenuation factor is, for example, 50% to 100%, preferably 70% to 100%, and more preferably 80% to 100%. Here, the attenuation factor is 100% when the light output reaches the minimum due to the interference, and 0% when the light output takes a midpoint between the maximum value and the minimum value. In a case of attenuating blue, it is sufficient that a3 and b3 are set to satisfy $m \approx 0.5, 1.0, 1.5, \ldots$.

Amplification and attenuation may be combined to make the light outputs of respective colors as uniform as possible. For example, red may be se to an amplification factor of 60% to 100%, preferably 70% to 100%, and more preferably 80% to 100%, green may be se to an amplification factor 0% to 70%, preferably 0% to 50%, and more preferably 0% to 30%, and blue may be se to an attenuation factor of 60% to 100%, preferably 70% to 100%, and more preferably 80% to 100%. In this case, the amplification and the attenuation due to the interference effect of the light are preferably controlled within a range of $0.1<m<1.5$, preferably $0.4<m<1.1$, and more preferably $0.5<m<0.9$.

In addition to the thicknesses a1 to a3, b2, and b3, the interference may be controlled based on the thicknesses of the strain relaxation layer 16A, the first strain relaxation layer 18A, and the second strain relaxation layer 18B.

3. Operation of Light Emitting Element

Next, an operation of the light emitting element according to the first embodiment will be described. In the light emitting element according to the first embodiment, red light can be emitted from the third active layer 18 by applying a voltage between the p electrode 24A and the n electrode 23, green light can be emitted from the second active layer 16 by applying a voltage between the p electrode 24B and the n electrode 23, and blue light can be emitted from the first active layer 14 by applying a voltage between the p electrode 24C and the n electrode 23. In addition, two or more of blue, green, and red can be emitted at the same time. In this way, in the light emitting element according to the first embodiment, blue, green, and red light emission can be controlled by selecting the electrode to which a voltage is applied, and it can be used as one pixel of a display.

Figure 2:
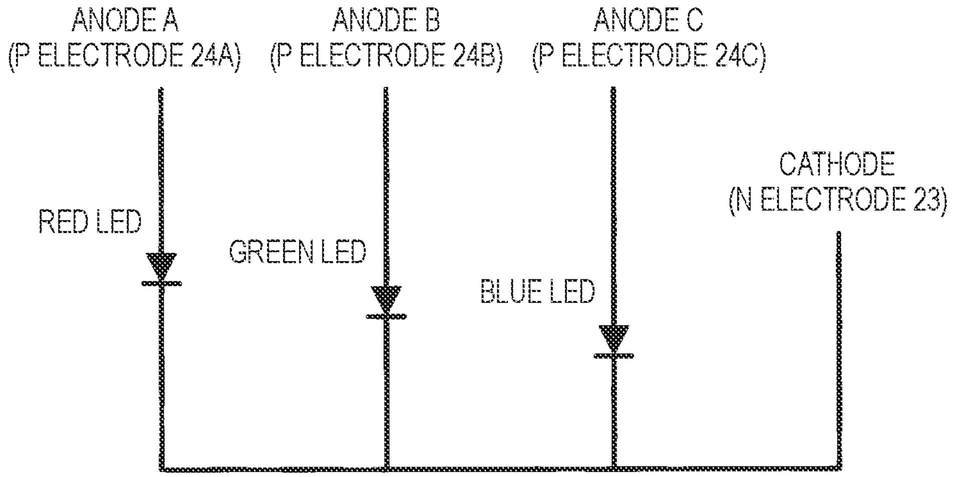
FIG. 2 is a diagram showing an equivalent circuit of the light emitting element according to the first embodiment.

FIG. 2 shows an equivalent circuit of the light emitting element according to the first embodiment. As shown in FIG. 2, the light emitting element according to the first embodiment has a structure in which blue, green, and red LEDs are formed in one element, and full-color light emission can be realized with one element. Therefore, it is possible to make a size of one element much smaller than a case of preparing blue, green, and red LEDs separately and arranging LEDs on the same substrate to prepare a full-color light emitting element of one pixel. Further, with the structure in the first embodiment, a step of preparing and arranging blue, green, and red LEDs separately can be omitted, the production cost can also be remarkably reduced, and a very low-cost full-color light emitting element and a light emitting display using the same can be realized.

4. Process for Producing Light Emitting Element

Next, a process for producing the light emitting element according to the first embodiment will be described with reference to the drawings.

First, the substrate 10 is prepared, and the substrate is subjected to a heat treatment by adding hydrogen, nitrogen, and, if necessary, ammonia.

Figure 3:
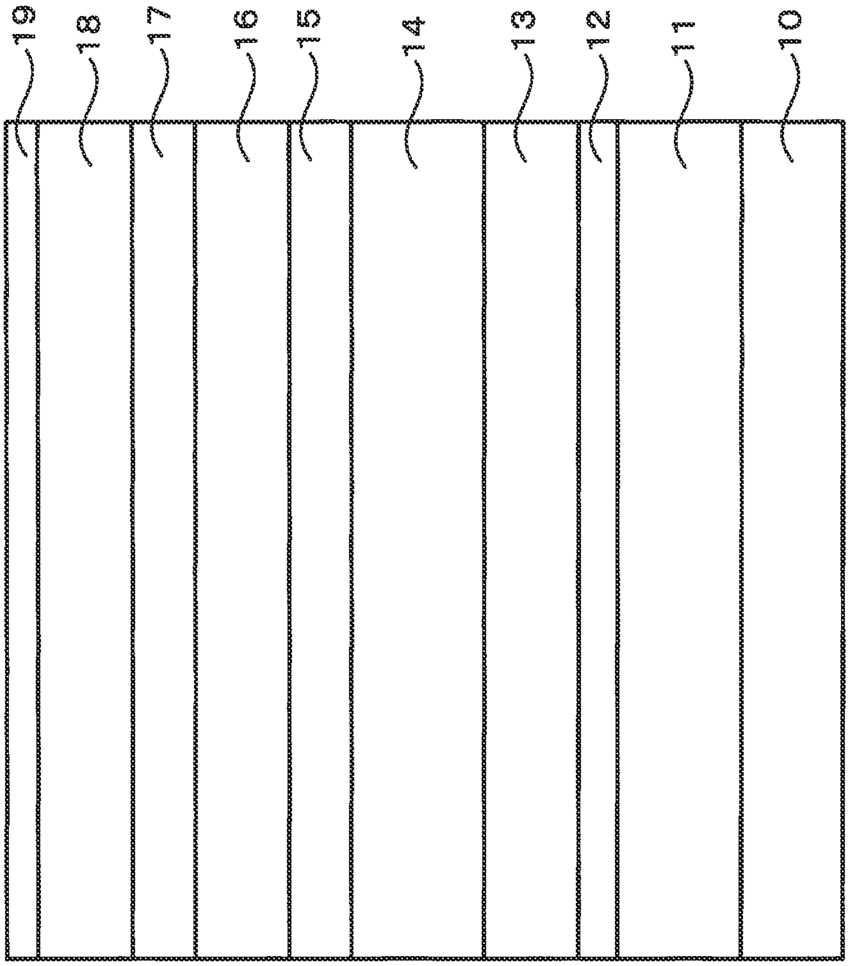
FIG. 3 is a diagram showing a process for producing the light emitting element according to the first embodiment.

Next, a buffer layer is formed on the substrate 10, and the n layer 11, the ESD layer 12, the base layer 13, the first active layer 14, the first middle layer 15, the second active layer 16, the second middle layer 17, the third active layer 18, and the protective layer 19 are sequentially formed on the buffer layer (see FIG. 3). The preferred growth temperature for each layer is as follows.

The growth temperature for the first active layer 14 is preferably 700° C. to 950° C. The crystal quality can be improved and the light emission efficiency can be increased. The first active layer 14 includes a well layer and a barrier layer, and the well layer and the barrier layer may be formed at the same temperature or may be formed at different temperatures within the above temperature range. When the temperatures are different, it is preferable that the growth temperature for the well layer is lower than the growth temperature for the barrier layer.

The growth temperature for the first middle layer 15 is preferably 700° C. to 1000° C. This is for preventing thermal damage to the first active layer 14. When the temperature is lower than 700° C., pits and point defects due to threading dislocations are likely to occur. The growth temperature is more preferably 800° C. to 950° C., and still more preferably 850° C. to 950° C.

The growth temperature for the second active layer 16 is preferably 650° C. to 950° C. The crystal quality can be improved and the light emission efficiency can be increased. The second active layer 16 includes a well layer and a barrier layer, and the well layer and the barrier layer may be formed at the same temperature or may be formed at different temperatures within the above temperature range. When the temperatures are different, it is preferable that the growth temperature for the well layer is lower than the growth temperature for the barrier layer. In addition, the growth temperature for the second active layer 16 is preferably lower than the growth temperature for the first active layer 14.

The growth temperature for the second middle layer 17 is preferably in a range same as that of the growth temperature for the first middle layer 15. However, the growth temperature for the second middle layer 17 is preferably lower than the growth temperature for the first middle layer 15. This is because the second active layer 16 that emits green light is more susceptible to thermal damage than the first active layer 14 that emits blue light, and an influence of the strain at an interface is larger.

The growth temperature for the third active layer 18 is preferably 500° C. to 950° C. The crystal quality can be improved and the light emission efficiency can be increased. The third active layer 18 includes a well layer and a barrier layer, and the well layer and the barrier layer may be formed at the same temperature or may be formed at different temperatures within the above temperature range. When the temperatures are different, it is preferable that the growth temperature for the well layer is lower than the growth temperature for the barrier layer. In addition, the growth temperature for the third active layer 18 is preferably lower than the growth temperature for the second active layer 16.

The growth temperature for the protective layer 19 is preferably 500° C. to 950° C. This is for preventing thermal damage to the first active layer 14, the second active layer 16, and the third active layer 18. In order to improve crystallinity of the protective layer 19, the growth temperature is preferably high, more preferably 600° C. to 900° C., and still more preferably 700° C. to 900° C.

Figure 4:
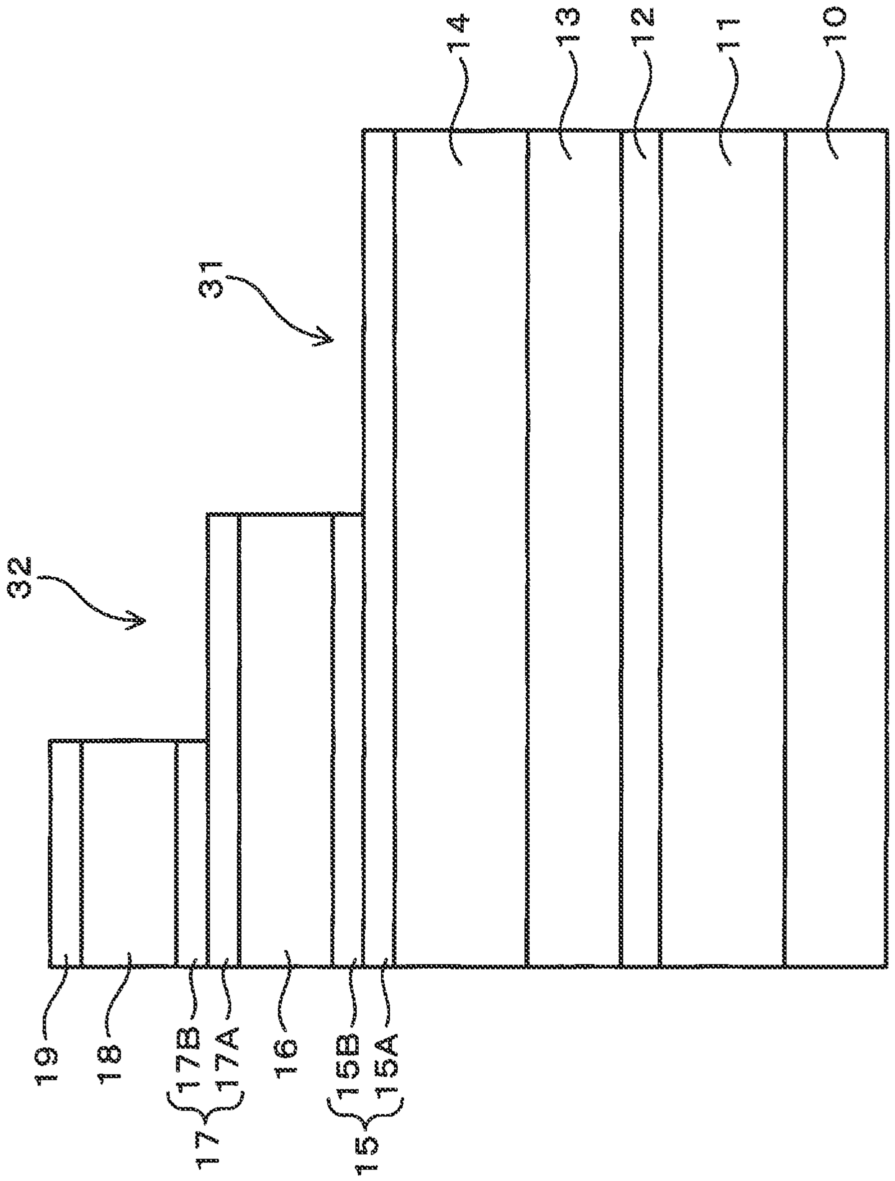
FIG. 4 is a diagram showing the process for producing the light emitting element according to the first embodiment.

Next, a partial region on a surface of the protective layer 19 is dry-etched until it reaches the non-doped layer 17A of the second middle layer 17 to form the third groove 32, and is dry-etched until it reaches the non-doped layer 15A of the first middle layer 15 to form the second groove 31 (see FIG. 4).

With the formation of the third groove 32 and the second groove 31, the non-doped layer 17A of the second middle layer 17 and the non-doped layer 15A of the first middle layer 15 are also etched. For the thickness b2 of the non-doped layer 17A and the thickness b3 of the non-doped layer 15A in a region etched to be thin, the etching depth is set to satisfy m≈0.2, 0.7, 1.2, . . . in the expressions (1) to (3).

The etching depth of the non-doped layer 17A and the non-doped layer 15A is, for example, 5 nm to 50 nm. Within this range, the non-doped layer 17A and the non-doped layer 15A can be exposed with high accuracy. The etching depth is more preferably 5 nm to 35 nm, and still more preferably 5 nm to 20 nm.

In addition, the thicknesses b2 and b3 are preferably set to 5 nm or more. This is for keeping the regrowth interface away from the first active layer 14 and the second active layer 16 to prevent impurities at the regrowth interface from influencing the first active layer 14 and the second active layer 16.

In the process of forming the third groove 32 and the second groove 31, the wafer is once taken out of the growth furnace, subjected to an etching step, and then returned to the growth furnace. Therefore, the wafer is exposed to the atmosphere, and a surface of the wafer is contaminated with impurities such as O and Si.

Next, the non-n layers 20A to 20C are formed on the protective layer 19, on the non-doped layer 17A of the second middle layer 17 exposed by the third groove 32, and on the non-doped layer 15A of the first middle layer 15 exposed by the second groove 31. The interface between the protective layer 19 and the non-n layer 20A, the interface between the non-doped layer 17A and the non-n layer 20B, and the interface between the non-doped layer 15A and the non-n layer 20C are regrowth interfaces and impurities such as O and Si are present.

The growth temperature for the non-n layers 20A to 20C is, for example, 800° C. to 1000° C. This is for preventing thermal damage to the first active layer 14, the second active layer 16, and the third active layer 18. The growth temperature is preferably 850° C. to 950° C., and more preferably 875° C. to 925° C.

A growth rate of the non-n layers 20A to 20C is preferably 0.5 nm/min to 5 nm/min. This is because a non-n layer grown on a roughly etched surface or a contaminated surface tends to have a rougher surface when the growth rate is high, and the surfaces of the non-n layers 20A to 20C can be made flat by slowly growing each atomic layer at a low growth rate.

A Mg/III gas phase ratio (a molar ratio of a Mg dopant gas to a group III metal raw material gas) is preferably 0.0005 to 0.02. Within this range, the regrowth interface can be sufficiently neutralized and the light output can be improved. The Mg/III gas phase ratio is particularly preferably 0.002 to 0.02.

Next, the electron blocking layers 21A to 21C are formed on the non-n layers 20A to 20C. The growth temperature for the electron blocking layers 21A to 21C is preferably 750° C. to 1000° C. This is for preventing thermal damage to the first active layer 14, the second active layer 16, and the third active layer 18. The growth temperature is more preferably 750° C. to 950° C., and still more preferably 800° C. to 900° C.

Figure 5:
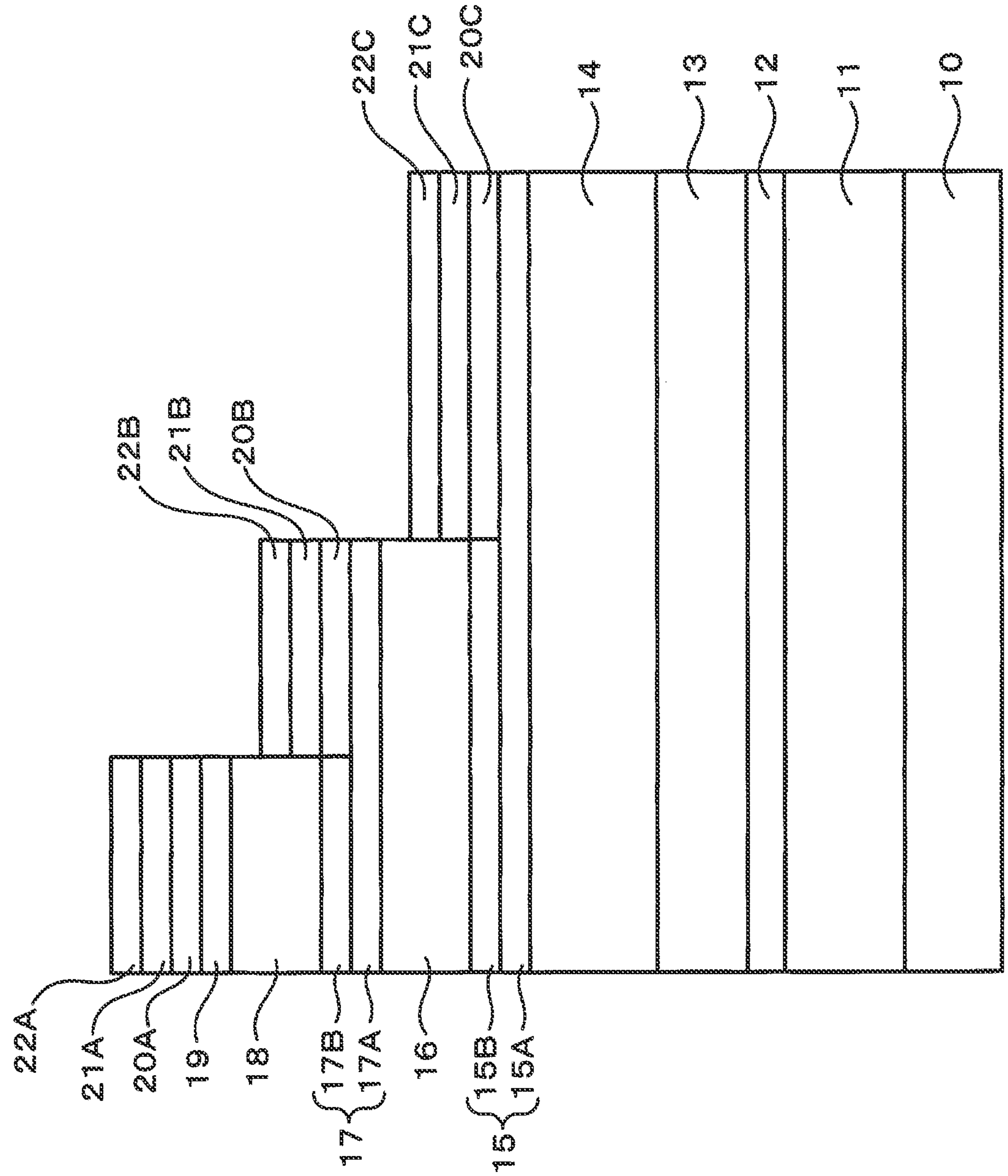
FIG. 5 is a diagram showing the process for producing the light emitting element according to the first embodiment.

Next, the p layers 22A to 22C are formed on the electron blocking layers 21A to 21C (see FIG. 5). The growth temperature for the p layers 22A to 22C is preferably 650° C. to 1000° C. The growth temperature is more preferably 700° C. to 950° C., and still more preferably 750° C. to 900° C.

Note that, in the above, the non-n layers 20A to 20C, the electron blocking layers 21A to 21C, and the p layers 22A to 22C are grown at the same time, and the thicknesses a1 to a3 are the same. Alternatively, when the thicknesses a1 to a3 are to be different, it is sufficient that each is formed separately.

Figure 6:
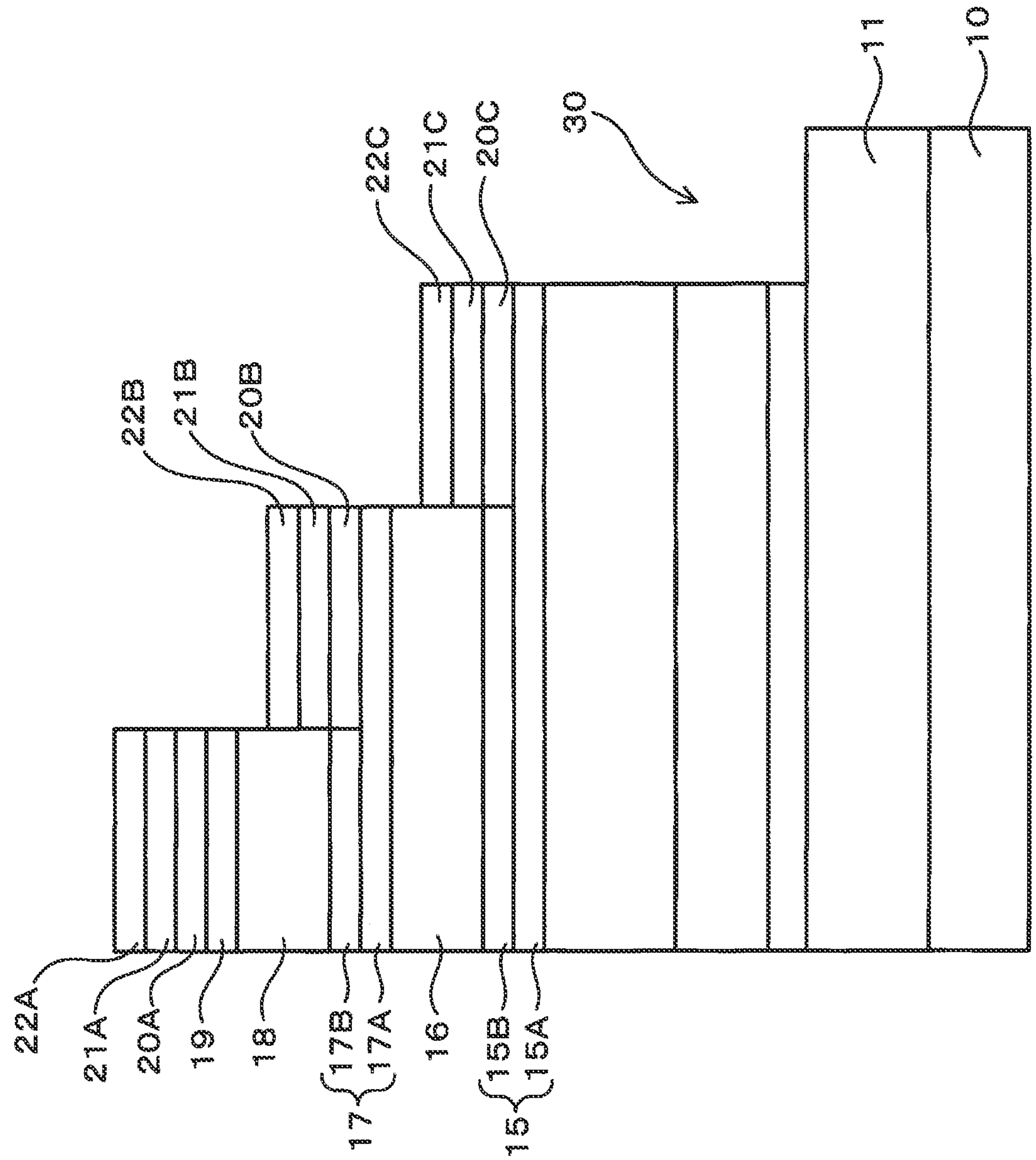
FIG. 6 is a diagram showing the process for producing the light emitting element according to the first embodiment.

Next, a partial region on a surface of the p layer 22C is dry-etched until it reaches the n layer 11 to form the first groove 30 (see FIG. 6). Then, the n electrode 23 is formed on the n layer 11 exposed on the bottom surface of the first groove 30, and the p electrodes 24A to 24C are formed on the p layers 22A to 22C. With the above, the light emitting element according to the first embodiment is produced.

5. Various Modifications Note that, the non-n layers 20A to 20C, the electron blocking layers 21A to 21C, and the p layers 22A to 22C are provided separately in the first embodiment, and may be provided as one continuous layer. In this case, the non-n layer, the electron blocking layer, and the p layer are also formed on a side surface of the third groove 32 and a side surface of the second groove 31, but this hardly influences the operation of the element. The reasons are as follows.

When the p electrode 24A, the p electrode 24B, and the p electrode 24C are sufficiently separated spatially, almost no current flows because resistance of the p layer connecting the p electrode 24A, the p electrode 24B, and the p electrode 24C is very high. In addition, since mobility of holes is low, the holes do not spread in a lateral direction from a region in contact with the electrode, but flow predominantly in a vertical direction through the pn junction directly below the electrode. Therefore, even when the non-n layers 20A to 20C, the electron blocking layers 21A to 21C, and the p layers 22A to 22C are continuous, the operation of the element is not influenced. That is, when a current is passed through the p electrode 24A, a current flows directly below the p electrode 24A, and as a result, the active layer directly below the p electrode 24A emits light, whereas a current flows in the active layer directly below the p electrodes 24B and 24C, and light emission almost never occurs.

In addition, an insulating film may be provided on the side surface of the third groove 32 and the side surface of the second groove 31. This insulating film may leave behind a mask for selectively growing the non-n layers 20A to 20C, the electron blocking layers 21A to 21C, and the p layers 22A to 22C.

Second Embodiment

Figure 7:
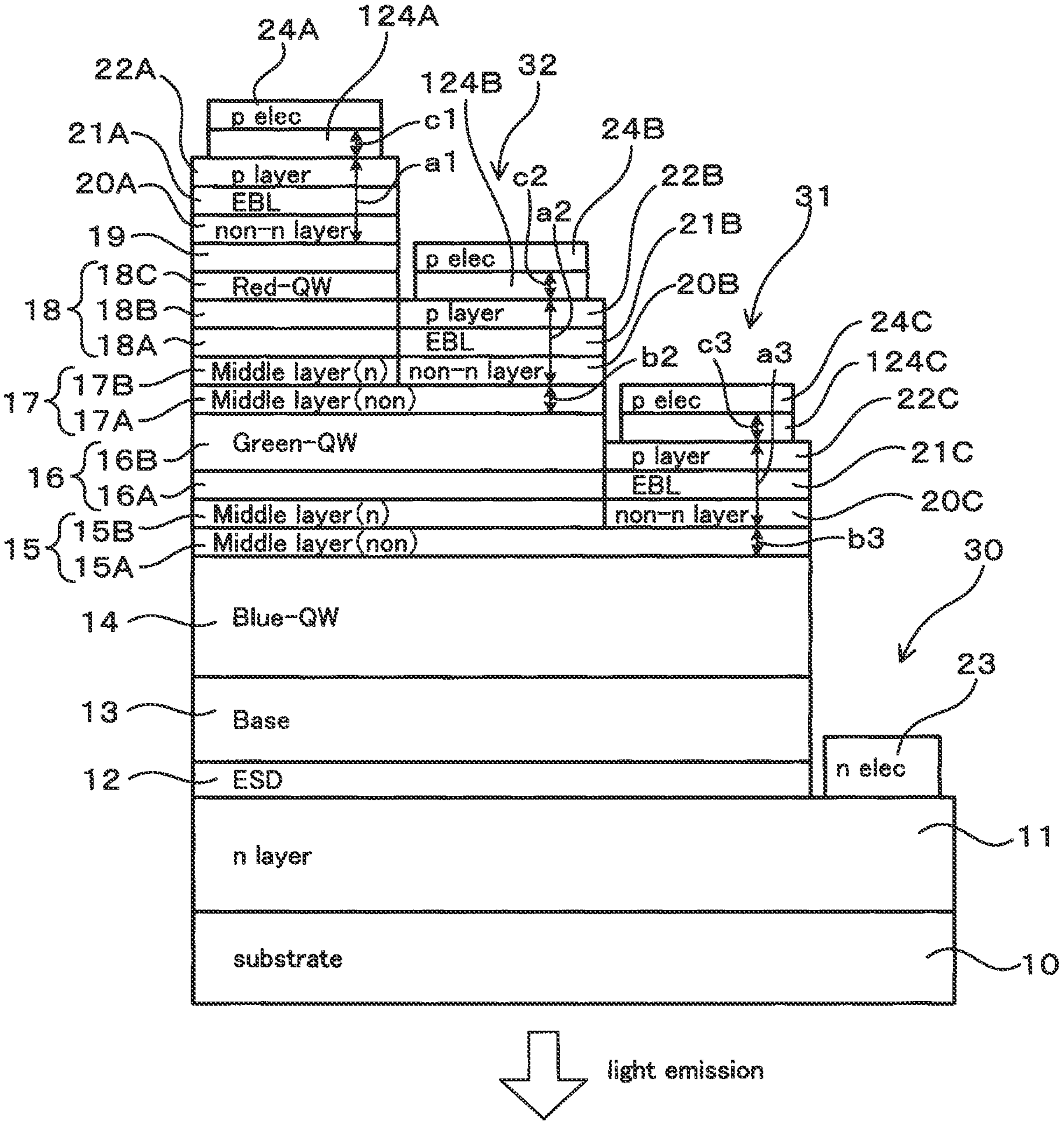
FIG. 7 is a diagram showing a configuration of a light emitting element according to a second embodiment, and is a cross-sectional view in a direction perpendicular to a main surface of a substrate.

FIG. 7 is a diagram showing a configuration of a light emitting element according to a second embodiment, and is a cross-sectional view in a direction perpendicular to a main surface of a substrate. As shown in FIG. 7, the light emitting element according the a second embodiment includes transparent electrodes 124A to 124C respectively provided between the p layers 22A to 22C and the p electrodes 24A to 24C of the light emitting element according to the first embodiment. The transparent electrodes 124A to 124C are made of, for example, ITO or IZO. Hereinafter, thicknesses of the transparent electrodes 124A to 124C are referred to as c1 to c3.

In the light emitting element according to the second embodiment, interference of light is controlled based on the thicknesses c1 to c3 in addition to the thicknesses a1 to a3, b2, and b3, and the thicknesses are set such that light emission colors of red, green, and blue are amplified. That is, the thicknesses a1 to a3, b2, b3, and c1 to c3 are set to satisfy the following expressions (4) to (6).

$$(m-0.1)\times(\lambda R/nR) < a1 + c1 < (m+0.1)\times(\lambda R/nR) \quad (4)$$

$$(m-0.1)\times(\lambda G/nG) < a2 + b2 + c2 < (m+0.1)\times(\lambda R/nR) \quad (5)$$

$$(m-0.1)\times(\lambda B/nB) < a3 + b3 + c3 < (m+0.1)\times(\lambda B/nB) \quad (6)$$

In the expressions (4) to (6), $m \approx 0.2, 0.7, 1.2, \ldots$.

When setting the thicknesses a1 to a3, b2, b3, and c1 to c3, it is preferable to fix the thicknesses to predetermined values by setting a1=a2=a3 and b2=b3, and to adjust c1 to c3. As described in the first embodiment, the non-n layers 20A to 20C, the electron blocking layers 21A to 21C, and the p layers 22A to 22C can be formed all at once, and the third groove 32 and the second groove 31 can also be etched under the same conditions, and therefore, the production process can be simplified. Of course, the thicknesses may be fixed to predetermined values by setting a1=a2=a3, and b2, b3, and c1 to c3 may be adjusted.

In addition, the thicknesses may be fixed to predetermined values by setting b2=b3 and c1=c2=c3, and a1 to a3 may be adjusted, or the thicknesses may be fixed to predetermined values by setting c1=c2=c3, and a1 to a3, b2, and b3 may be adjusted. In addition, the thicknesses may be fixed to predetermined values by setting b2=b3, a1 to a3 and c1 to c3 may be adjusted.

Third Embodiment

Figure 8:
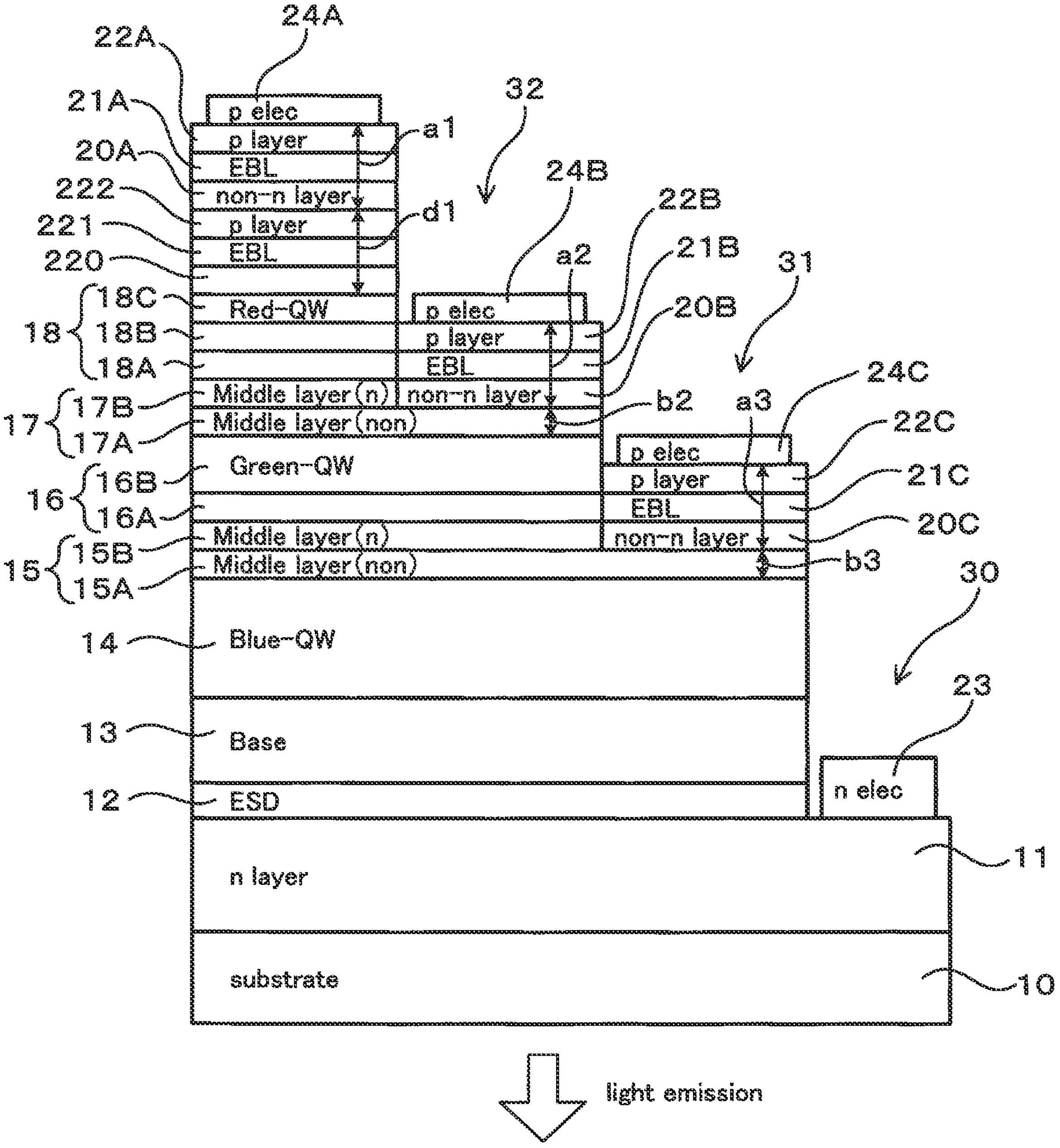
FIG. 8 is a diagram showing a configuration of a light emitting element according to a third embodiment, and is a cross-sectional view in a direction perpendicular to a main surface of a substrate.

FIG. 8 is a diagram showing a configuration of a light emitting element according to a third embodiment, and is a cross-sectional view in a direction perpendicular to a main surface of a substrate. As shown in FIG. 8, the light emitting element according to the third embodiment has a structure in which a strain relaxation layer 220, an electron blocking layer 221, and a p contact layer 222 are sequentially stacked instead of the protective layer 19.

The strain relaxation layer 220, the electron blocking layer 221, and the p contact layer 222 are layers continuously formed on the third active layer 18. After forming the p contact layer 222, the third groove 32 and the second groove 31 are formed, and then the non-n layers 20A to 20C, the electron blocking layers 21A to 21C, and the p layers 22A to 22C are regrown.

In the light emitting element according to the third embodiment, an interface between the p contact layer 222 and the non-n layer 20A, the interface between the non-doped layer 17A and the non-n layer 20B, and the interface between the non-doped layer 15A and the non-n layer 20C are regrowth interfaces.

The third active layer 18 emits red light and may be greatly influenced by the regrowth interface, resulting in a reduction in light emission efficiency. Therefore, in the light emitting element according to the third embodiment, the strain relaxation layer 220, the electron blocking layer 221, and a p contact layer 222 are provided on the third active layer 18 to increase a distance from the third active layer 18 to the regrowth interface. Accordingly, the influence of the regrowth interface on the third active layer 18 can be reduced. In addition, the regrowth interface is sandwiched between two p layers, and non-light-emitting recombination at the regrowth interface can be prevented. Therefore, the reduction in light emission efficiency of the third active layer 18 can be prevented.

The strain relaxation layer 220 is a layer provided on the third active layer 18 and is a layer for relaxing strain in the third active layer 18. A material of the strain relaxation layer 220 is a group III nitride semiconductor containing In, for example, non-doped InGaN. The In composition is, for example, 0.1% to 10%.

The electron blocking layer 221 is a layer provided on the strain relaxation layer 220, and is a layer for blocking electrons in order to efficiently confine the electrons in the third active layer 18. The electron blocking layer 221 can have a configuration same as that of the electron blocking layers 21A to 21C. The electron blocking layer 221 is preferably of p-type.

The p contact layer 222 is a layer provided on the electron blocking layer 221. A material of the p contact layer 222 is, for example, p-GaN or p-AlGaN. It can also have a configuration same as that of the p layer 22A. When the p contact layer 222 is provided, the regrowth interface is sandwiched between p-type layers, the regrowth interface can be effectively neutralized or made to be p-type, and the non-light-emitting recombination can be prevented. In addition, the p contact layer 222 also functions as a layer for supplying holes to the third active layer 18. A Mg concentration in the p contact layer 222 is, for example, $1\times10^{18}$ $cm^{-3}$ to $100\times10^{18}$ $cm^{-3}$.

Note that, the strain relaxation layer 220 or the p contact layer 222 may be omitted, and only the electron blocking layer 221 may be provided. When the p contact layer 222 is omitted, the electron blocking layer 221 and the electron blocking layer 21A are integrated to form a thick electron blocking layer, and therefore the function as an electron blocking layer can be improved.

A total film thickness of the strain relaxation layer 220, the electron blocking layer 221, and the p contact layer 222 is set to d1, and the thicknesses a1 and d1 are set to satisfy $(m-0.1)\times(\lambda R/nR)<a1+d1<(m+0.1)\times(\lambda R/nR)$, $m\approx0.2$, 0.7, 1.2, . . . . Accordingly, the red light emitted from the third active layer 18 can be amplified by interference of the light. Note that, as described in the first embodiment, it is not necessary to strictly satisfy this expression, and it is sufficient as long as it is within the range where the red light can be amplified. Settings are made so as to amplify green light and blue light similarly to the first embodiment.

When setting the thicknesses a1 to a3, b2, b3, and d1, it is preferable to fix the thicknesses to predetermined values by setting a1=a2=a3, and to adjust b2, b3, and d1. As described in the first embodiment, the non-n layers 20A to 20C, the electron blocking layers 21A to 21C, and the p layers 22A to 22C can be formed all at once, and the production process can be simplified. In addition, the thicknesses may be fixed to predetermined values by setting b2=b3, and a1 to a3 and d1 may be adjusted.

Experimental Example 1

Various experimental examples according to the embodiment will be described.

A light emitting element (sample 1) was prepared by sequentially stacking an n layer, an n-SL (n-superlattice layer), an MQW layer that emits blue light, a middle layer, an EBL (electron blocking layer), and a p layer on a sapphire substrate. SIMS analysis was performed on the sample 1, and depth profiles were determined for the elements O, Si, and C.

In addition, a light emitting element (sample 2) was prepared by sequentially stacking an n layer, an n-SL, an MQW layer that emits blue light, and a middle layer on a sapphire substrate, then once taking the wafer out from the growth furnace and exposing the surface of the wafer to the atmosphere, then charging the wafer back into the growth furnace, and sequentially stacking an EBL and a p layer on the middle layer. The sample 2 has a configuration same as that of the sample 1 except that it is exposed to the atmosphere after the middle layer is formed and before the EBL is formed. SIMS analysis was performed on the sample 2, and depth profiles were determined for the elements O, Si, and C.

Figure 9:
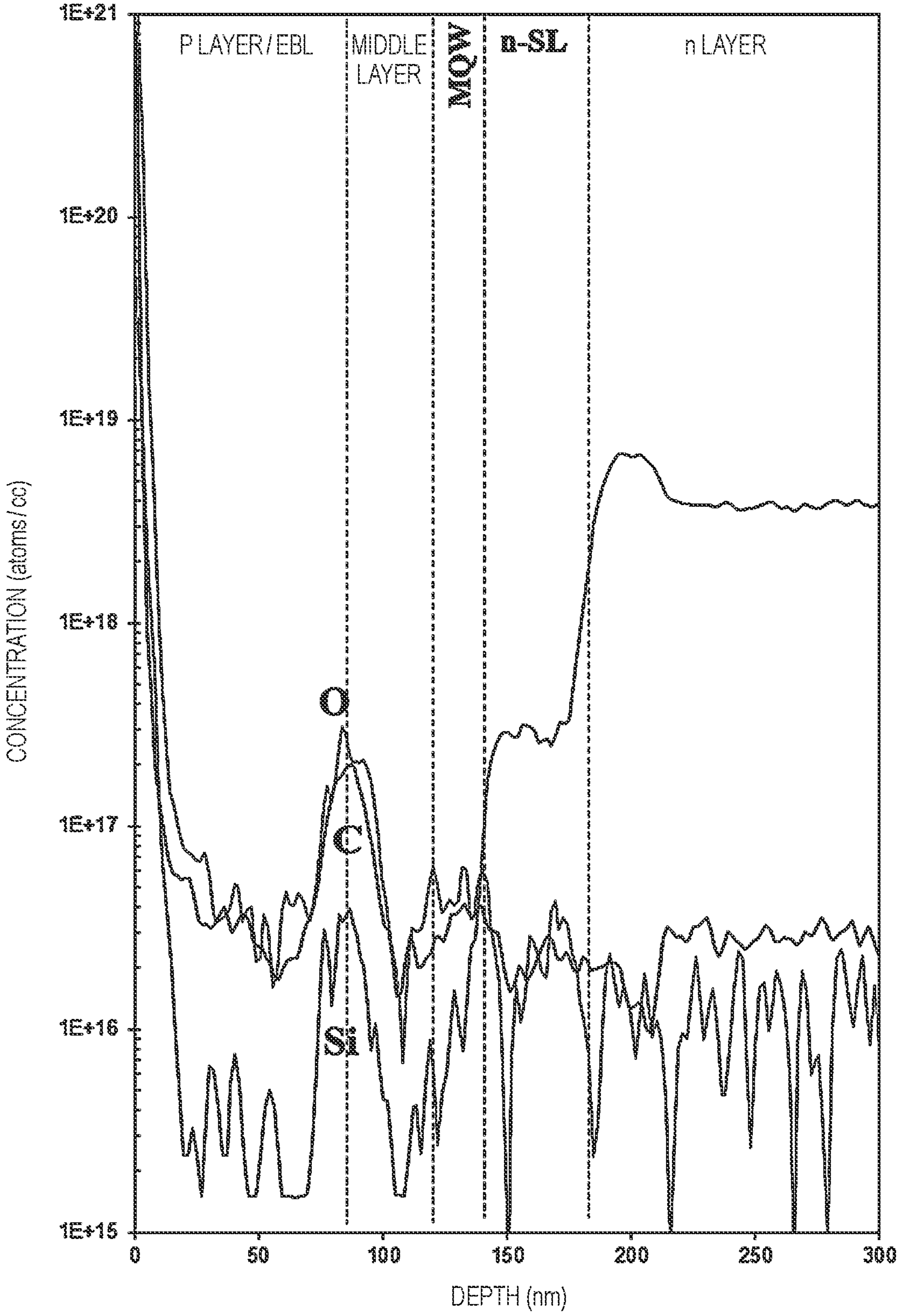
FIG. 9 is a graph showing depth profiles of O, Si, and C.
Figure 10:
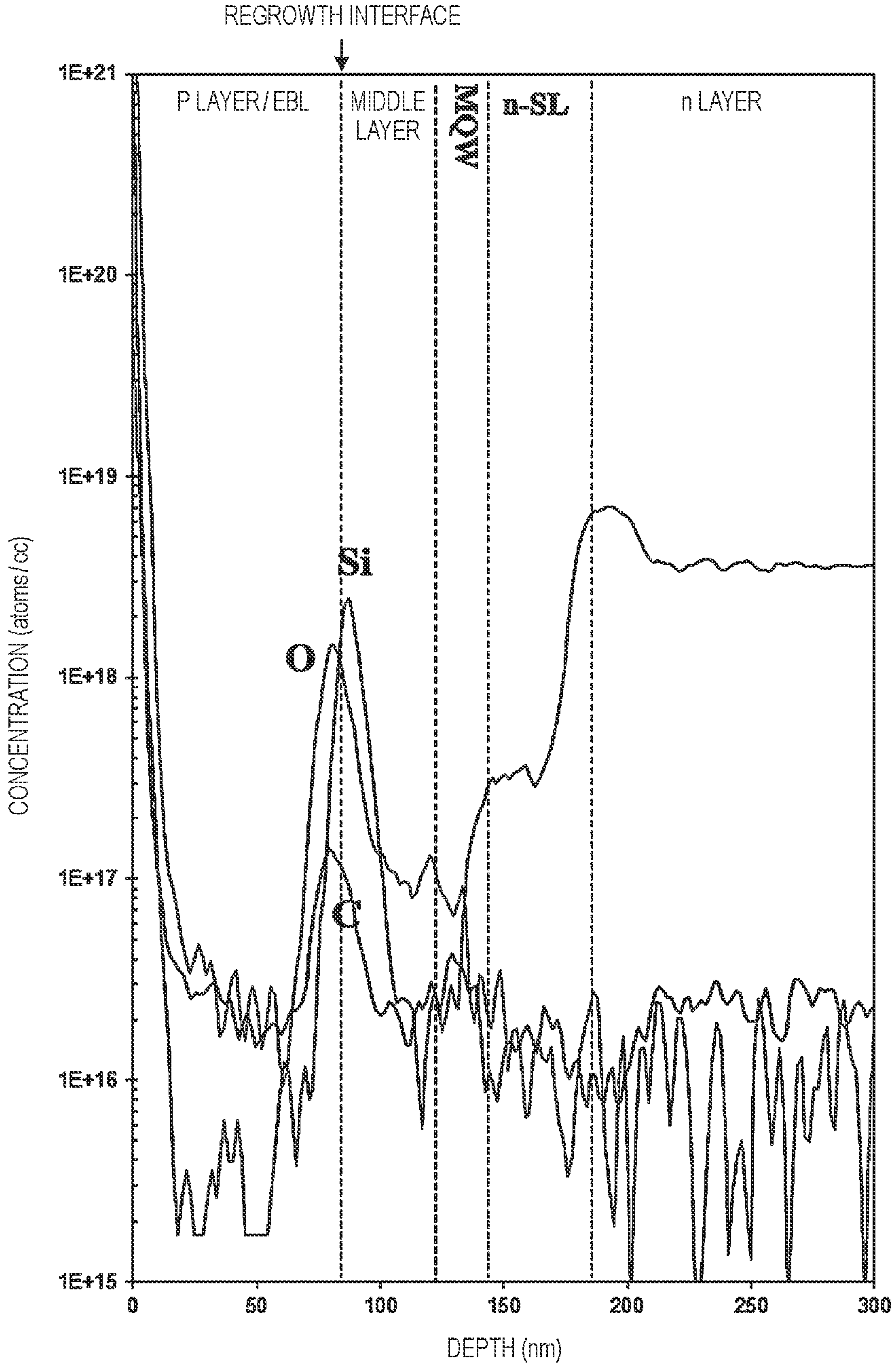
FIG. 10 is a graph showing depth profiles of O, Si, and C.

FIG. 9 shows depth profiles of O, Si, and C for the sample 1, and FIG. 10 shows depth profiles of O, Si, and C for the sample 2.

As shown in FIG. 9, in the sample 1, the concentrations of O and Si at an interface between the middle layer and the EBL are about $2\times10^{17}$ $cm^{-3}$ to $3\times10^{17}$ $cm^{-3}$. This is considered to be the impurity concentration due to the influence of residual impurities in the furnace being taken in due to the temporary interruption of growth when changing the growth temperature. It is possible to reduce it to the detection limit of SIMS analysis by optimizing the growth conditions.

On the other hand, as shown in FIG. 10, in the sample 2, sharp peaks of O and Si are seen at the regrowth interface (interface between the middle layer and the EBL), and it is found that the concentrations of O and Si are about $1\times10^{18}$ $cm^{-3}$ to $3\times10^{18}$ $cm^{-3}$, which is higher than the concentration in the sample 1. As shown in FIG. 9 and FIG. 10, it is found that the regrowth interface is clearly contaminated with impurities such as O and Si. The concentration of these impurities increases or decreases depending on the degree of exposure to the atmosphere or the condition of the surface where the groove is formed, and can reach a maximum concentration of $100\times10^{18}$ $cm^{-3}$, although it also depends on a cleaning method used before regrowth. Therefore, it is found that in order to make the regrowth interface to be non-n-type, it is necessary to dope Mg in an amount of about $0.1\times10^{18}$ $cm^{-3}$ to $100\times10^{18}$ $cm^{-3}$.

Figure 11:
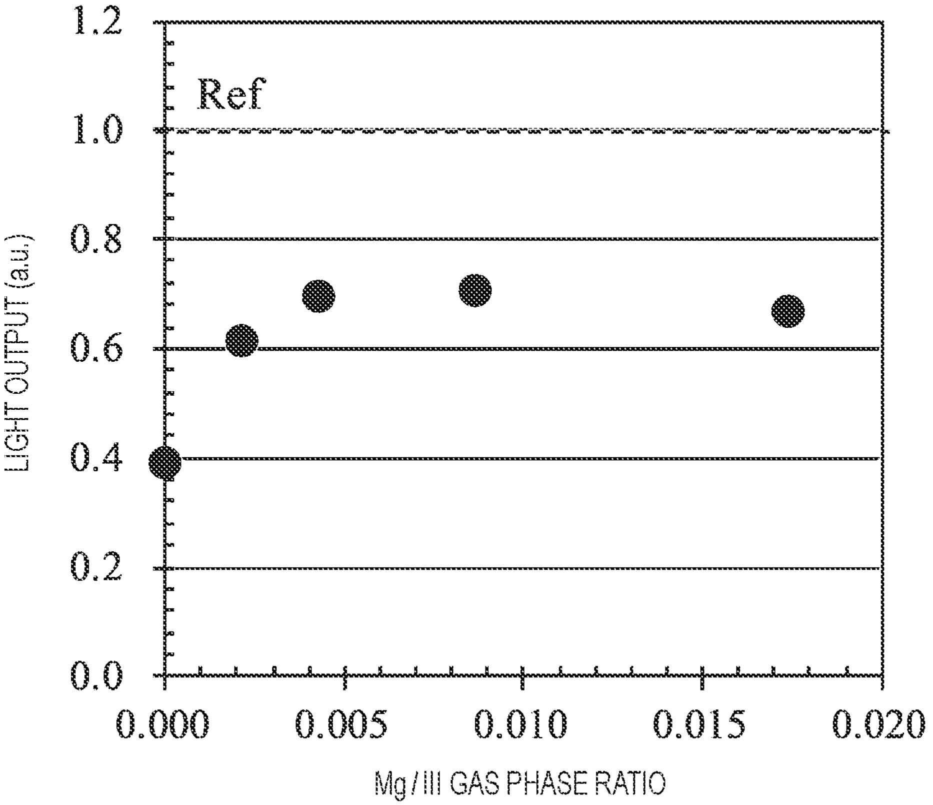
FIG. 11 is a graph showing a relationship between a Mg/III gas phase ratio and a light output.

Next, for the sample 2, the amount of Mg doped at an initial stage of EBL formation (that is, the non-n layer) was varied, and the light output was measured. FIG. 11 is a graph showing a relationship between the Mg/III gas phase ratio and the light output when growing a non-n layer. The Mg/III gas phase ratio is the molar ratio of the Mg dopant gas to the group III metal raw material gas when forming a non-n layer by MOCVD. In addition, the light output was normalized by setting the light output of the sample 1 to 1 (the dotted line shown as Ref in FIG. 11).

As shown in FIG. 11, as the Mg/III gas phase ratio increases, the light output also increases, and when the Mg/III gas phase ratio is 0.005 or more, the light output remains constant at approximately 0.7. It is considered that the Mg doping makes the regrowth interface to be non-n-type, and the light output is increased.

Experimental Example 2

A light emitting element (sample 3) was prepared by sequentially stacking an n layer, an n-SL, a blue light emitting layer, a middle layer, a green light emitting layer, a middle layer, a red light emitting layer, an EBL (about 30 nm), and a p layer (about 70 nm) on a sapphire substrate, then once taking the wafer out from the growth furnace and exposing the surface of the wafer to the atmosphere, then charging the wafer back into the growth furnace, and sequentially stacking an EBL (about 30 nm) and a p layer (about 30 nm to 170 nm) on the p layer. A reflective electrode for p was made of Ni (about 10 nm)/Au (about 50 nm). The emission wavelength of the red light emitting layer was 590 nm. A plurality of samples 3 were prepared by changing the thickness of the p layer as a regrowth layer to various values (about 30 nm to 170 nm). Then, the light output of the sample 3 was measured.

In addition, a light emitting element (sample 4) was prepared by sequentially stacking an n layer, an n-SL, a blue light emitting layer, a middle layer, a green light emitting layer, an EBL (about 25 nm), and a p layer (about 75 nm to 175 nm) on a sapphire substrate. A reflective electrode for p was made of Ni (about 10 nm)/Au (about 50 nm). The emission wavelength of the green light emitting layer was 530 nm. A plurality of samples 4 were prepared by changing the thickness of the p layer to various values (about 75 nm to 175 nm). Then, the light output of the sample 4 was measured.

Figure 12:
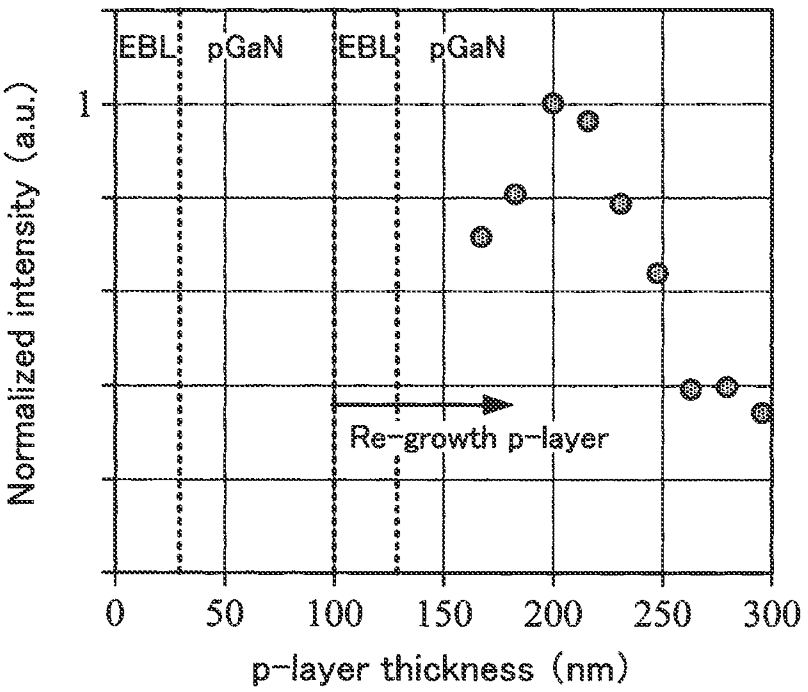
FIG. 12 is graph showing a relationship between a light output of red light emission and a p-layer thickness.

FIG. 12 is graph showing a relationship between a light output of red light emission and a p-layer thickness for the sample 3. In FIG. 12, the light output on the vertical axis is a value normalized with the maximum value being 1. The p-layer thickness on the horizontal axis is the thickness of the layer above the red light emitting layer, and corresponds to the value of a1+d1 in the third embodiment.

Figure 13:
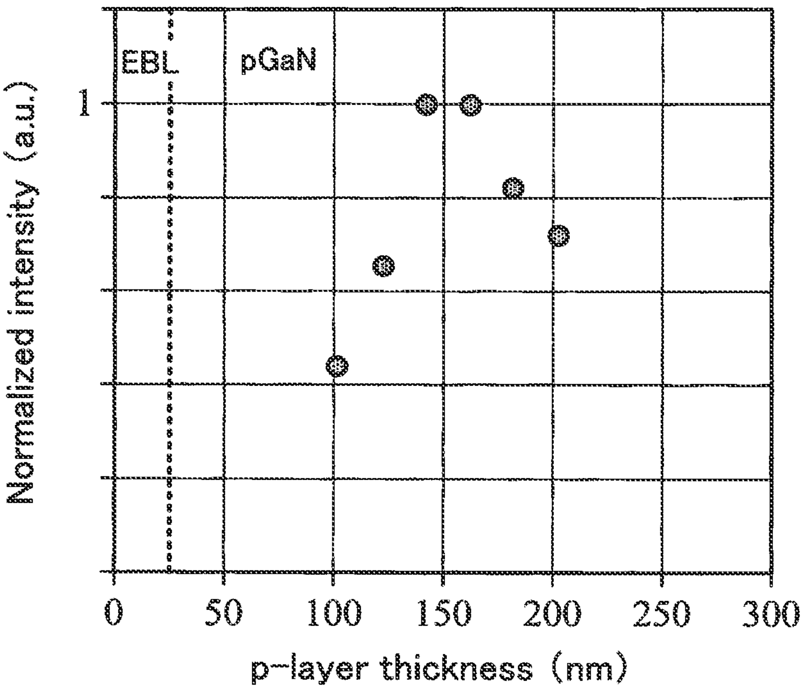
FIG. 13 is graph showing a relationship between a light output of green light emission and the p-layer thickness.

FIG. 13 is graph showing a relationship between a light output of green light emission and a p-layer thickness for the sample 4. The light output on the vertical axis is a value normalized with the maximum value being 1. The p-layer thickness on the horizontal axis is the thickness of the layer above the green light emitting layer, and corresponds to the value of a2+b2 (b2=0) in the expression (2) in the first embodiment.

Figure 14:
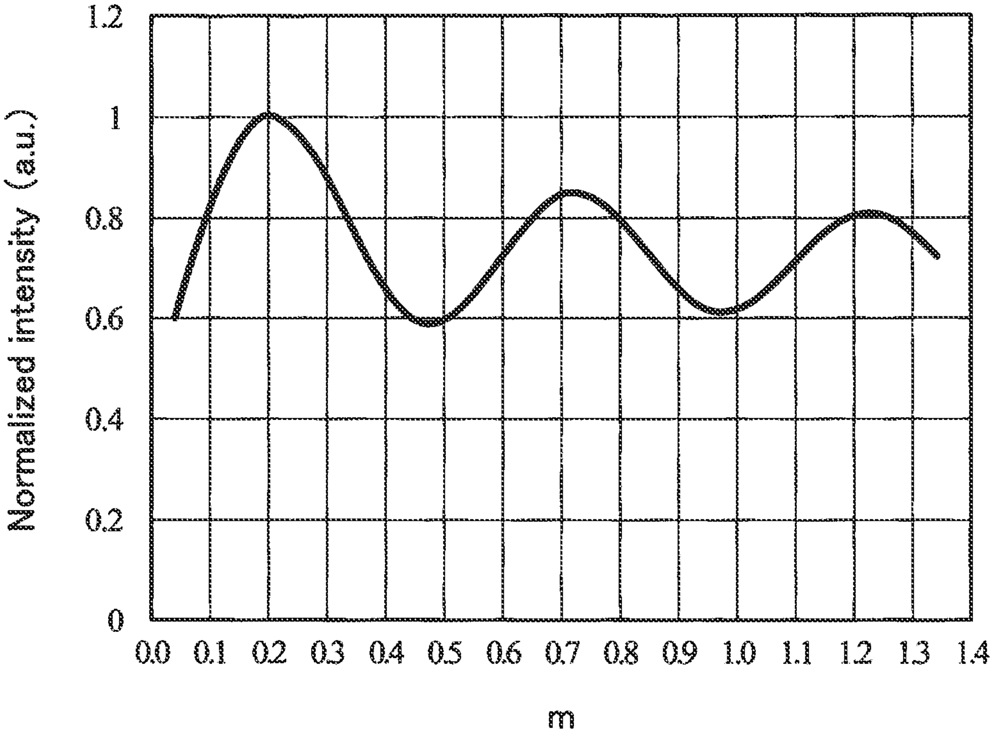
FIG. 14 is graph showing a relationship between the light output and an optical thickness derived from a theoretical formula.

FIG. 14 is a graph showing the light output and the value of m derived from a theoretical formula, and is a graph showing results of calculating the total light output by integrating intensities in an incident angle range of 0 to 90 degrees in the theoretical formula for the light output. In FIG. 14, the light output on the vertical axis is a value normalized with the maximum value being 1. The horizontal axis is a value of an optical thickness normalized by a wavelength λ' in a medium, and corresponds to the value of m in the expressions (1) to (6) in the first embodiment and the second embodiment. By multiplying the value of m by the wavelength λ' in the medium (wavelength λ in vacuum÷refractive index n of medium), the film thickness from the light emitting surface to the reflective surface (optical film thickness) can be obtained. Accordingly, it is possible to understand the film thickness dependence of the interference effect of the light at any wavelength.

As shown in FIG. 14, it is found that the light output increases and decreases periodically, and there is a peak of the light output at m≈0.2, 0.7, 1.2, . . . and a bottom of the light output at m≈0.5, 1.0, 1.5, . . . .

In addition, as shown in FIG. 12, it is found that there is a peak of the light output when the p-layer thickness is 200 nm. It is found that when the emission wavelength is 590 nm and the refractive index is 2.38, m=0.8, which approximately matches the theoretical value of 0.7 shown in FIG. 14.

In addition, as shown in FIG. 13, it is found that there is a peak of the light output when the p-layer thickness is 150 nm. It is found that when the emission wavelength is 530 nm and the refractive index is 2.38, m=0.67, which approximately matches the theoretical value of 0.7 shown in FIG. 14.

From FIG. 12 and FIG. 13, it is confirmed that controlling the interference of the light using the methods in the first embodiment to the third embodiment is appropriate.

Other Modifications

The light emitting elements according to the first embodiment to the third embodiment each include three active layers, i.e., the first active layer 14, the second active layer 16, and the third active layer 18. Alternatively, the present invention is applicable to any structure having two or more active layers with different emission wavelengths. In addition, the emission color is not limited to blue, green, or red, but may be any color as long as the emission wavelengths are different. For example, it may have two active layers of blue and yellow, or it may have four active layers of blue, green, red, and purple or yellow.

In addition, it is preferable that the light emitting elements according to the first embodiment to the third embodiment are driven in a PWM manner by a PWM circuit to control light emission. The light intensity can be easily controlled based on a pulse width and a pulse period, and wavelength shifts due to a difference in drive current can also be prevented.

REFERENCE SIGNS LIST

10: substrate
11: n layer
12: ESD layer
13: base layer
14: first active layer
15: first middle layer
16: second active layer
17: second middle layer
18: third active layer
19: protective layer
20A to 20C: non-n layer
21A to 21C: electron blocking layer
22A to 22C: p layer
23: n electrode
24A to 24C: p electrode
15A, 17A: non-doped layer
15B, 17B: n layer
16A: strain relaxation layer
16B, 18C: quantum well structure layer
18A: first strain relaxation layer
18B: second strain relaxation layer

What is claimed is:

1. A light emitting element comprising a group III nitride semiconductor, comprising:

a substrate;

an n layer that is provided over the substrate and comprises an n-type group III nitride semiconductor;

a first active layer that is provided over the n layer and has a predetermined emission wavelength;

a middle layer that is provided over the first active layer and comprises a group III nitride semiconductor containing In;

a second active layer that is provided over the middle layer and has an emission wavelength different from the emission wavelength of the first active layer;

a groove having a depth reaching the middle layer from a side of the second active layer;

a first p layer that is provided over the second active layer and comprises a p-type group III nitride semiconductor; and a second p layer that is provided over the middle layer exposed on a bottom surface of the groove and comprises a p-type group III nitride semiconductor, wherein a non-n layer comprising a group III nitride semiconductor and containing O or Si and a p-type impurity is provided between the second active layer and the first p layer and between the middle layer and the second p layer.

2. The light emitting element according to claim 1, wherein the non-n layer comprises a group III nitride semiconductor containing Al, and has an Al composition of 0.5% to 30%.

3. The light emitting element according to claim 2, wherein a p-type impurity concentration in the non-n layer is $1\times10^{18}$ $cm^{-3}$ to $100\times10^{18}$ $cm^{-3}$.

4. The light emitting element according to claim 1, wherein a p-type impurity concentration in the non-n layer is $1\times10^{18}$ $cm^{-3}$ to $100\times10^{18}$ $cm^{-3}$.

5. A method for producing a light emitting element comprising a group III nitride semiconductor, comprising:

an n layer forming step of forming an n layer comprising an n-type group III nitride semiconductor over a substrate;

a first active layer forming step of forming a first active layer having a predetermined emission wavelength over the n layer;

a middle layer forming step of forming a middle layer comprising a group III nitride semiconductor containing In over the first active layer;

a second active layer forming step of forming a second active layer having an emission wavelength different from the emission wavelength of the first active layer over the middle layer;

a groove forming step of forming a groove having a depth reaching the middle layer from a side of the second active layer; and a p layer forming step of forming a first p layer comprising a p-type group III nitride semiconductor and a second p layer comprising a p-type group III nitride semiconductor over the second active layer and over the middle layer exposed on a bottom surface of the groove, respectively, wherein a non-n layer comprising a group III nitride semiconductor and containing O or Si and a p-type impurity is formed after the groove forming step and before the p layer forming step.

6. The method for producing a light emitting element according to claim 5, wherein the non-n layer comprises a group III nitride semiconductor containing Al, and has an Al composition of 0.5% to 30%.

7. The method for producing a light emitting element according to claim 6, wherein a p-type impurity concentration in the non-n layer is $1\times10^{18}$ $cm^{-3}$ to $100\times10^{18}$ $cm^{-3}$.

8. The method for producing a light emitting element according to claim 6, wherein in the non-n layer forming step, a molar ratio of a p-type dopant gas to a group III metal raw material gas is 0.0005 or more and 0.02 or less.

9. The method for producing a light emitting element according to claim 5, wherein a p-type impurity concentration in the non-n layer is $1\times10^{18}$ $cm^{-3}$ to $100\times10^{18}$ $cm^{-3}$.

10. The method for producing a light emitting element according to claim 5, wherein in the non-n layer forming step, a molar ratio of a p-type dopant gas to a group III metal raw material gas is 0.0005 or more and 0.02 or less.

* * * * *